United States Patent
Kim et al.

(10) Patent No.: US 10,338,876 B2
(45) Date of Patent: Jul. 2, 2019

(54) DISPLAY PANELS AND MULTIVISION APPARATUSES

(71) Applicant: Samsung Electronics Co., Ltd., Suwon-si, Gyeonggi-do (KR)

(72) Inventors: Jun Youn Kim, Hwaseong-si (KR); Hyun Seong Kum, Hwaseong-si (KR); Young Hwan Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 22 days.

(21) Appl. No.: 15/333,692

(22) Filed: Oct. 25, 2016

(65) Prior Publication Data

US 2017/0286044 A1   Oct. 5, 2017

(30) Foreign Application Priority Data

Mar. 29, 2016   (KR) .................. 10-2016-0037812

(51) Int. Cl.
*G06F 3/14* (2006.01)
*G02F 1/1333* (2006.01)
(Continued)

(52) U.S. Cl.
CPC .......... *G06F 3/1446* (2013.01); *G02F 1/1368* (2013.01); *G02F 1/13336* (2013.01); *G02F 1/133514* (2013.01); *G02F 1/134336* (2013.01); *G09G 3/342* (2013.01); *G09G 3/3413* (2013.01); *H01L 25/0753* (2013.01); *H01L 27/3262* (2013.01); *H01L 27/3265* (2013.01); *H01L 27/3293* (2013.01); *H01L 33/504* (2013.01);
(Continued)

(58) Field of Classification Search
CPC . G06F 3/1446; G02F 1/13336; G09G 3/3413; G09G 3/342
See application file for complete search history.

(56) References Cited

U.S. PATENT DOCUMENTS 6,372,608 B1   4/2002   Shimoda et al.
6,645,830 B2   11/2003   Shimoda et al.
(Continued)

FOREIGN PATENT DOCUMENTS

CN   1591559 A   3/2005
CN   1900773 A   1/2007
(Continued)

OTHER PUBLICATIONS

Chinese Office Action dated Dec. 21, 2018 for corresponding Chinese Application No. 201710196508.7.

*Primary Examiner* — Ricardo Osorio
(74) *Attorney, Agent, or Firm* — Harness, Dickey & Pierce, P.L.C.

(57) ABSTRACT

A multivision apparatus may include a display panel that includes a display screen including a first region and an adjacent second region. The first region may include first pixels, and the second region may include second pixels. The first pixels and the second pixels have different structures. The display panel may display a single image across the first region and the second region of the display screen. The multivision apparatus may include an array of interconnected display panels configured to collectively display an image, based on each given display panel displaying a separate sub-image in the first and second regions of the given display panel.

18 Claims, 24 Drawing Sheets

(51) Int. Cl.
  *G02F 1/1335*   (2006.01)
  *G02F 1/1343*   (2006.01)
  *G02F 1/1368*   (2006.01)
  *G09G 3/34*     (2006.01)
  *H01L 25/075*   (2006.01)
  *H01L 27/32*    (2006.01)
  *H01L 33/50*    (2010.01)
  *H01L 33/54*    (2010.01)
  *H01L 33/62*    (2010.01)
  *G02F 1/1339*   (2006.01)
  *G02F 1/1362*   (2006.01)
  *G09G 3/3225*   (2016.01)
  *G09G 3/36*     (2006.01)
  *H01L 27/12*    (2006.01)

(52) U.S. Cl.
  CPC ............. *H01L 33/54* (2013.01); *H01L 33/62* (2013.01); *G02F 1/1339* (2013.01); *G02F 1/133345* (2013.01); *G02F 1/133528* (2013.01); *G02F 1/136286* (2013.01); *G02F 2201/121* (2013.01); *G02F 2201/123* (2013.01); *G09G 3/3225* (2013.01); *G09G 3/3648* (2013.01); *G09G 2300/026* (2013.01); *G09G 2300/0426* (2013.01); *G09G 2320/0626* (2013.01); *H01L 27/1255* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,400,370 B2 | 3/2013 | Yoshida et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2005/0057434 A1 | 3/2005 | Youn | |
| 2009/0256830 A1* | 10/2009 | Klinghult | G09G 3/3208 345/211 |
| 2011/0018849 A1 | 1/2011 | Lowe et al. | |
| 2011/0051019 A1 | 3/2011 | Hardacker et al. | |
| 2011/0115831 A1* | 5/2011 | Seo | G09G 3/3233 345/690 |
| 2011/0141358 A1 | 6/2011 | Hardacker et al. | |
| 2011/0162031 A1* | 6/2011 | Weon | H04N 21/4122 725/137 |
| 2011/0222004 A1* | 9/2011 | Kim | G02F 1/1393 349/106 |
| 2012/0182514 A1* | 7/2012 | Choi | G02F 1/134309 349/143 |
| 2012/0280895 A1* | 11/2012 | Yeh | G02F 1/1323 345/87 |
| 2013/0278872 A1 | 10/2013 | Teller et al. | |
| 2013/0279012 A1 | 10/2013 | Lee et al. | |
| 2014/0184472 A1 | 7/2014 | Xia et al. | |
| 2015/0009587 A1* | 1/2015 | Kim | G02B 5/045 359/837 |
| 2015/0015974 A1* | 1/2015 | Jeong | H04N 9/12 359/811 |
| 2015/0022424 A1 | 1/2015 | Jepsen | |
| 2015/0097837 A1 | 4/2015 | Jepsen et al. | |
| 2015/0138040 A1* | 5/2015 | Teramae | G06F 3/1446 345/1.3 |
| 2015/0138755 A1 | 5/2015 | Bastani et al. | |
| 2015/0286457 A1* | 10/2015 | Kim | G06F 3/1446 345/581 |
| 2015/0370113 A1 | 12/2015 | Kim et al. | |
| 2016/0238905 A1* | 8/2016 | Han | G02F 1/133707 |
| 2016/0358582 A1* | 12/2016 | Lee | G09G 5/10 |
| 2017/0168342 A1* | 6/2017 | Park | G02F 1/1334 |
| 2018/0108712 A1* | 4/2018 | Song | H01L 27/3211 |

FOREIGN PATENT DOCUMENTS

| | | |
|---|---|---|
| CN | 101644998 A | 2/2010 |
| CN | 201477830 U | 5/2010 |
| CN | 102184725 A | 9/2011 |
| CN | 103514811 A | 1/2014 |
| CN | 104090405 A | 10/2014 |
| CN | 104269128 A | 1/2015 |
| KR | 20140008734 A | 7/2014 |
| KR | 101436040 B1 | 8/2014 |
| KR | 20150018123 A | 2/2015 |
| KR | 101541397 B1 | 8/2015 |
| WO | WO-2015/009371 A1 | 1/2015 |

* cited by examiner

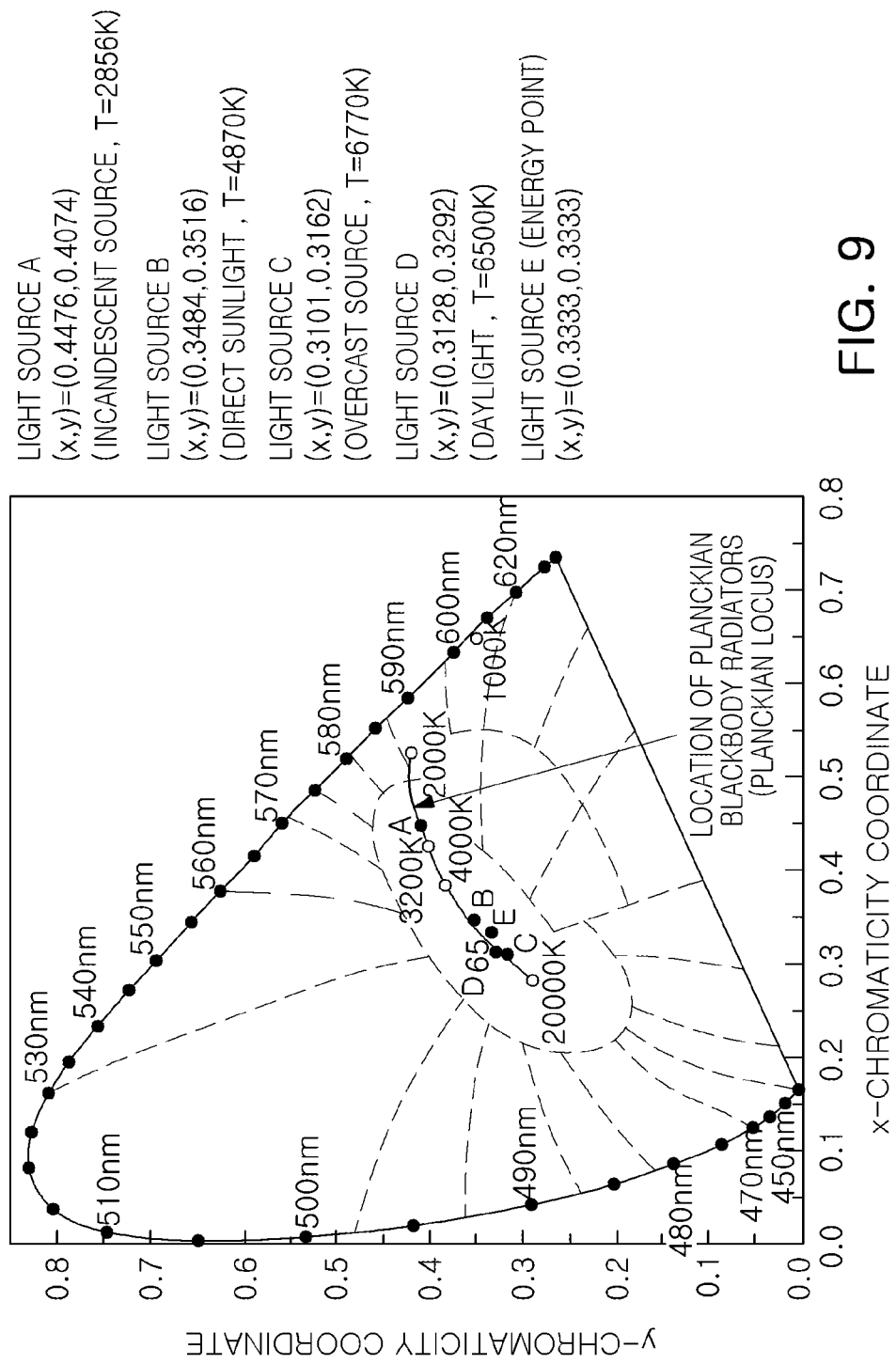

DISPLAY PANELS AND MULTIVISION APPARATUSES

CROSS-REFERENCE TO RELATED APPLICATIONS

This application claims benefit of priority to Korean Patent Application No. 10-2016-0037812 filed on Mar. 29, 2016 in the Korean Intellectual Property Office, the disclosure of which is incorporated herein by reference in its entirety.

BACKGROUND

1. Field

The present inventive concepts relate to display panels and multivision apparatuses.

2. Description of Related Art

As technologies for flat panel display devices have developed, the range of applications of flat panel display devices has been widely expanded. Therefore, recently, there is demand for manufacturing very large displays that include very large flat panel display devices.

In some cases, it may be difficult to manufacture very large displays that include very large flat panel display devices having a display panel size (e.g., the distance between opposite corners of the display panel) of 100 inches or greater using a single display panel, due to problems in terms of technologies and manufacturing costs.

In some cases, multivision apparatuses using a plurality of display panels have been developed. Multivision apparatuses are display devices allowing very large displays that include very large flat panel display devices to be formed in a manner in which a plurality of display panels are disposed contiguously. Such multivision apparatuses are able to display different images on respective unit display panels or display a single image on respective unit display panels, in such a manner that the image is divided.

However, in the case of such multivision apparatuses, heterogeneity may be present at the boundaries of unit display panels, due to the edge regions of respective unit display panels not displaying images. Therefore, there is a significant difference in visual quality between multivision apparatuses and a display device displaying using a single display panel.

SUMMARY

Some example embodiments of the present inventive concepts may provide a display panel without a region not configured to display an image and a multivision apparatus including the same.

According to some example embodiments of the present inventive concepts, a display panel may include a first region and a second region. The first region may include a plurality of first pixels, the plurality of first pixels included in at least one of one or more rows of pixels and one or more columns of pixels, each first pixel of the plurality of first pixels including a first pixel circuit including at least one switching device and at least one capacitor. The second region may include a plurality of second pixels, the plurality of second pixels included at least one of the one or more rows of pixels and the one or more columns of pixels, the second region adjacent to the first region, the second region having an area smaller than an area of the first region, each second pixel of the plurality of second pixels including a second pixel circuit having a structure different from a structure of the first pixel circuit. The first region and the second region may be configured to collectively display a single image.

According to some example embodiments of the present inventive concepts, a multivision apparatus may include at least one display panel that includes a plurality of first regions adjacent to each other in one or more rows and in one or more columns; and a plurality of second regions between the plurality of first regions, the first regions and the second regions configured to collectively display an individual image. The at least one display panel may include at least one second region of the plurality of second regions and at least one first region of the plurality of first regions.

According to some example embodiments of the present inventive concepts, a multivision apparatus may include an array of interconnected display panels collectively forming an individual multivision display screen. Each display panel may include a connector, a display screen, and a panel controller. The connector may be configured to receive an input image signal including information associated with an image. The display screen may include a first region of first pixels and a second region of second pixels, the first pixels and second pixels having different physical circuit structures, respectively. The panel controller may be configured to generate a display image based on processing the input image signal, and control the display screen to cause the first and second pixels to collectively display the display image.

BRIEF DESCRIPTION OF DRAWINGS

The above and other aspects, features and other advantages of the present inventive concepts will be more clearly understood from the following detailed description taken in conjunction with the accompanying drawings, in which:

FIG. 9 is a CIE 1931 color space chromaticity diagram illustrating a wavelength conversion material employable in a light source module according to some example embodiments of the present inventive concepts;

DETAILED DESCRIPTION

Figure 1:
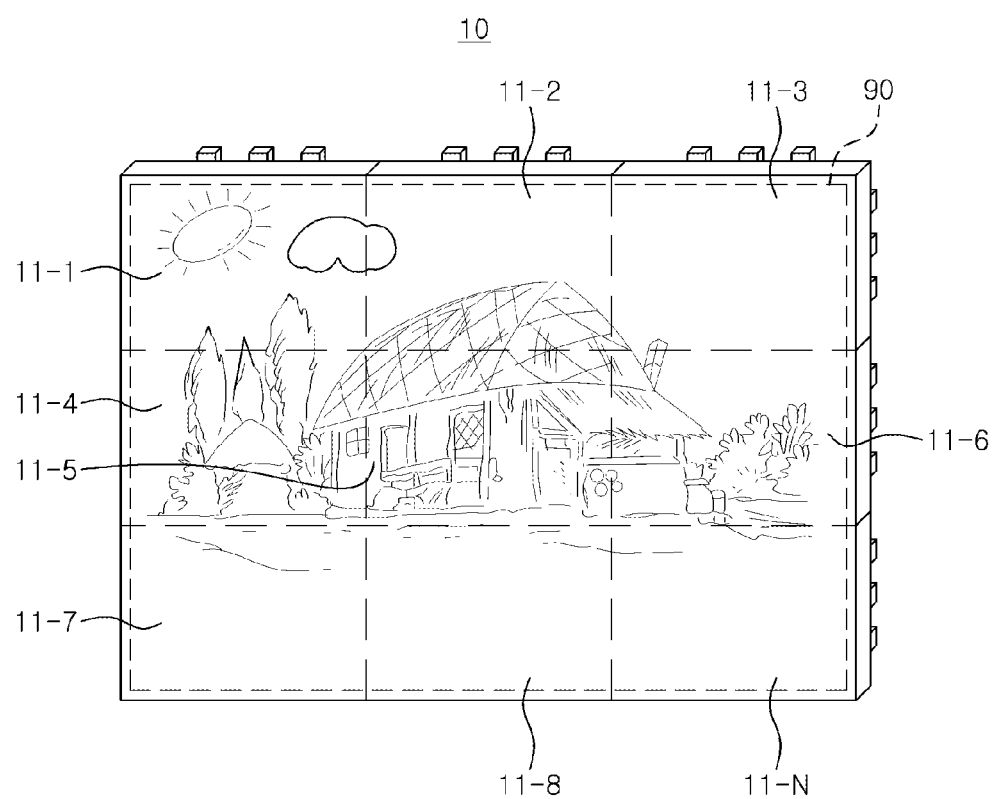
FIG. 1 is a schematic perspective view of a multivision apparatus according to some example embodiments of the present inventive concepts.
Figure 2:
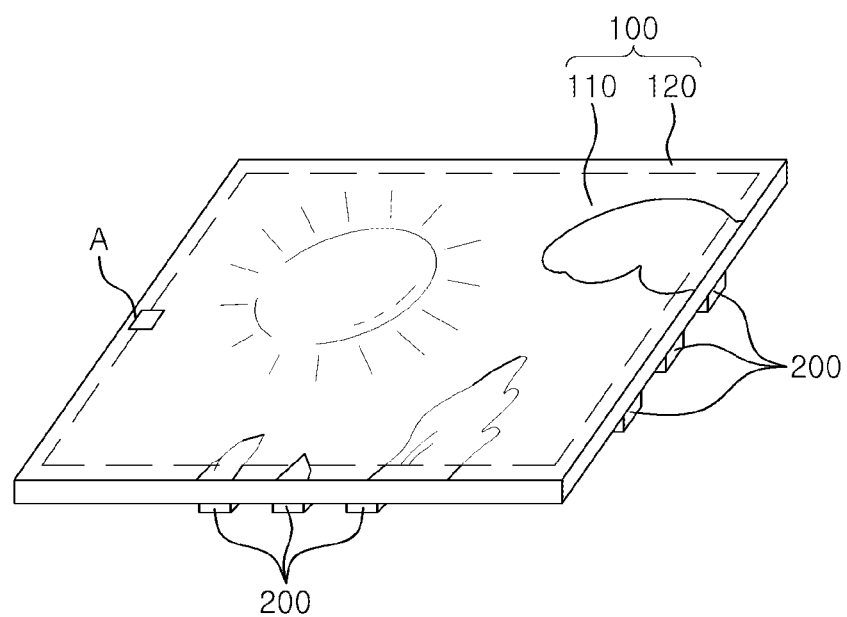
FIG. 2 is a schematic perspective view of a unit display panel of a multivision apparatus in FIG. 1.
Figure 3:
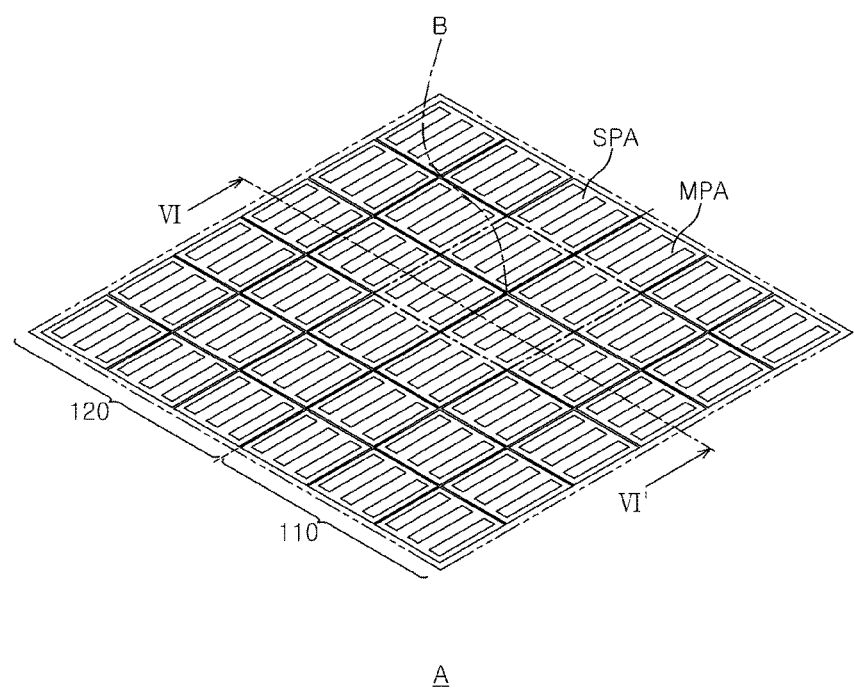
FIG. 3 is an enlarged view of portion A in FIG. 2.
Figure 4:
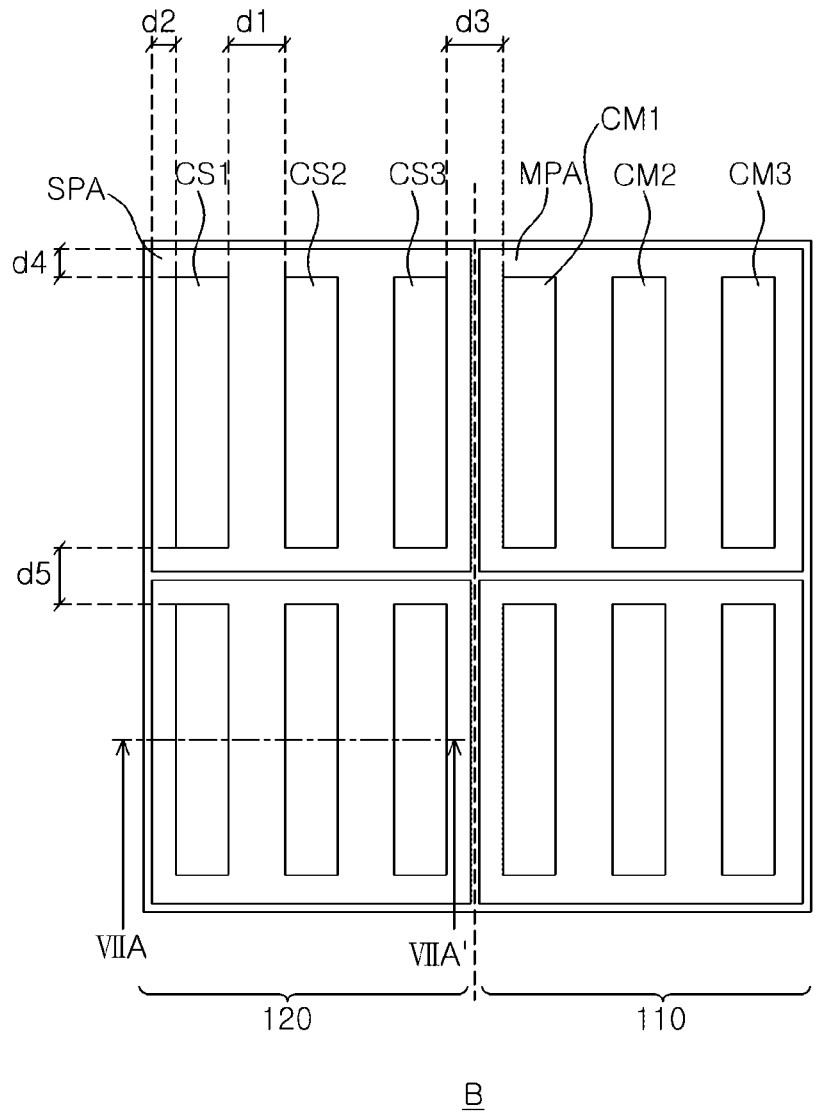
FIG. 4 is an enlarged view of portion B in FIG. 3.
Figure 5A:
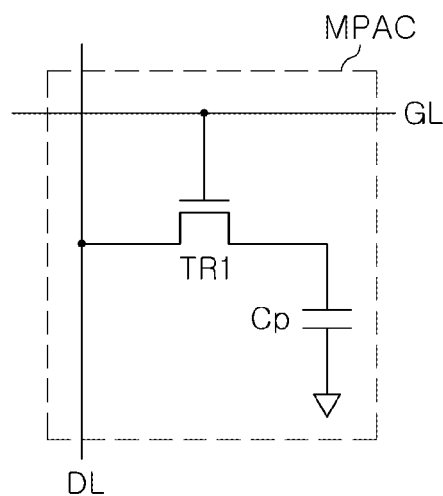
FIGS. 5A and 5B are views of a first pixel circuit and a second pixel circuit, included in a first pixel and a second pixel in FIG. 4, respectively.
Figure 5B:
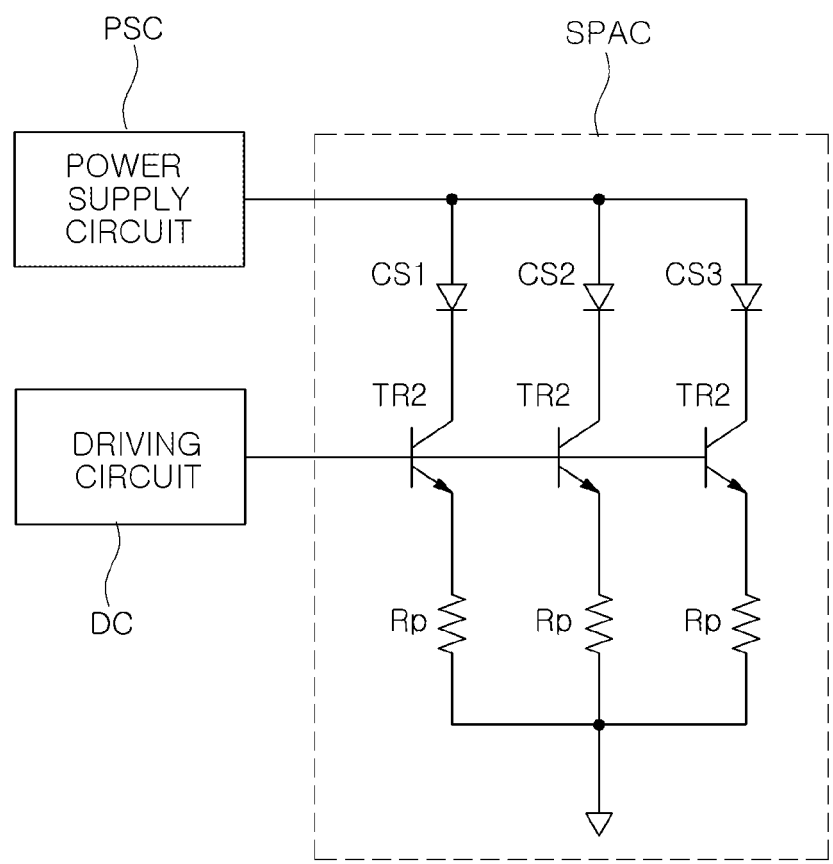
Figure 6:
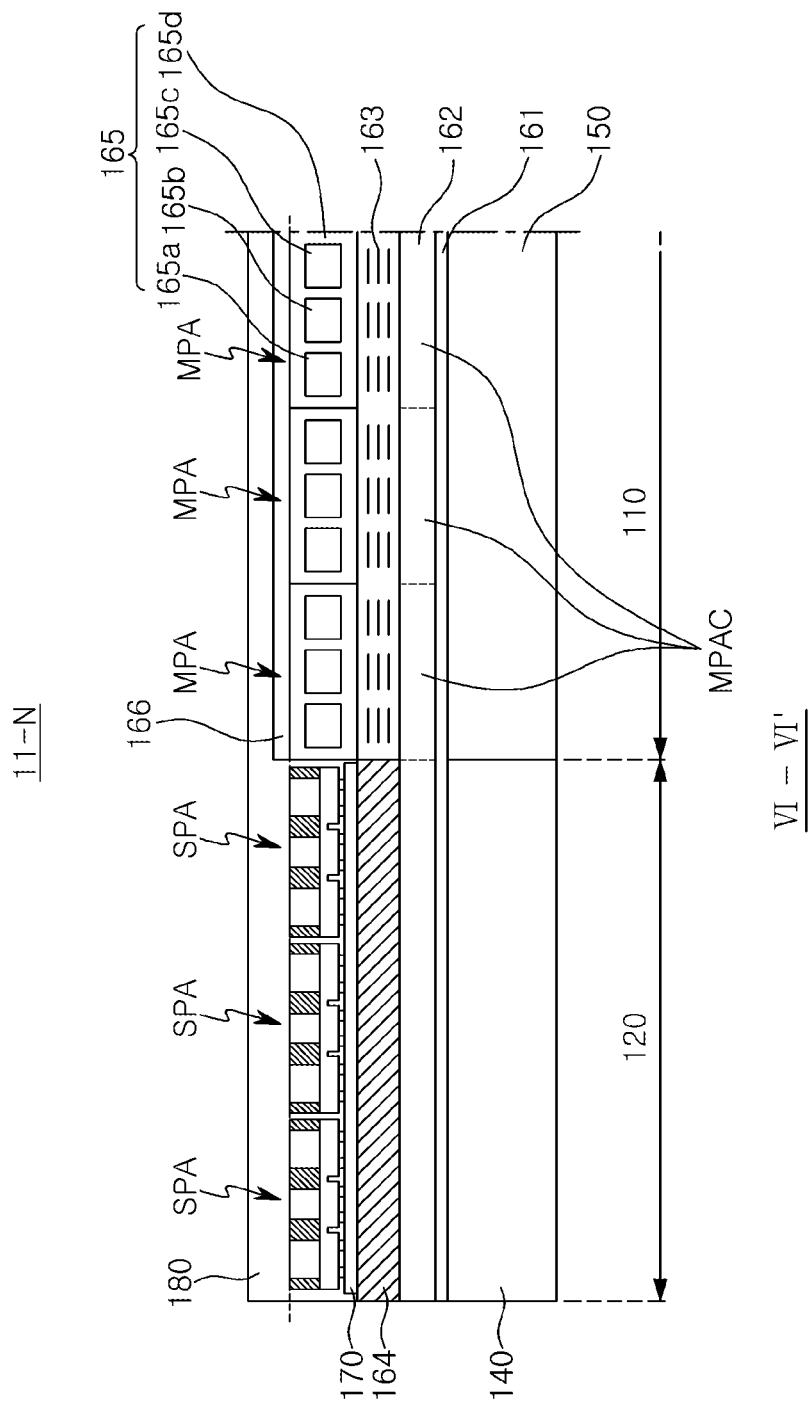
FIG. 6 is a side cross-sectional view taken along line VI-VI' of a unit display panel illustrated in FIG. 3.

FIG. 1 is a schematic perspective view of a multivision apparatus according to some example embodiments of the present inventive concepts, while FIG. 2 is a schematic perspective view of a unit display panel of the multivision apparatus in FIG. 1. In some example embodiments, FIG. 3 is an enlarged view of portion A in FIG. 2, and FIG. 4 is an enlarged view of portion B in FIG. 3. Furthermore, FIGS. 5A and 5B are views of a first pixel circuit and a second pixel circuit, included in a first pixel and a second pixel, respectively in FIG. 4, while FIG. 6 is a side cross-sectional view taken along line VI-VI' of a unit display panel illustrated in FIG. 3.

With reference to FIGS. 1 and 2, a multivision apparatus 10 according to some example embodiments may include an array of unit display panels 11-1 to 11-N. The unit display panels 11-1 to 11-N may be interconnected through one or more connectors. N may be any positive integer value. For example, in FIG. 1, N is a value of "nine," such that the multivision apparatus 10 includes an array of nine unit display panels 11-1 to 11-9. The array of unit display panels 11-1 to 11-N collectively form a multivision display screen of the multivision apparatus, based on the collective screen portions ("display screens") of the unit display panels 11-1 to 11-N. As shown in FIG. 1, the multivision apparatus 10 may be configured to display an image on a multivision display screen 90 that comprises the collective display screens of unit display panels 11-1 to 11-N. According to some example embodiments, the number ("quantity") of unit display panels 11-1 to 11-N included in the multivision apparatus 10 is not limited to nine unit display panels 11-1 to 11-9, as shown in at least FIG. 1. The multivision apparatus 10 may display different images on each of the unit display panels 11-1 to 11-N in the array. In some example embodiments, two or more of the unit display panels 11-1 to 11-N may display a common image. As shown in example embodiments illustrated in at least FIG. 1, the multivision apparatus 10 may display a single image on the array of unit display panels 11-1 to 11-N by dividing the image into separate sub-images, where each sub-image is a separate portion of image. As shown in FIG. 1, each unit display panel 11-1 to 11-N in the array may display a separate sub-image of the image, and the array of unit display panels 1-1 to 11-N collectively display the image based on each displaying a separate sub-image of the image. Each of the unit display panels 11-1 to 11-N may be equal or substantially equal (e.g., equal within manufacturing and/or material tolerances) to each other in terms of size, but may also be different, according to some example embodiments.

With reference to FIGS. 2 and 3, a unit display panel 11-N may include a screen portion 100 and a connector 200. The unit display panel 11-N illustrated in at least FIGS. 2-3 may be any of the unit display panels 11-1 to 11-N included in the multivision apparatus 10, including unit display panel 11-1.

The screen portion 100 may be disposed to overlay a front surface of the unit display panel 11-N. Therefore, an image displayed on the screen portion 100 may be displayed over an entirety or substantially an entirety (e.g., an entirety within manufacturing and/or material tolerances) of the front surface of the unit display panel 11-N. The screen portion 100 may include a first region 110 and a second region 120. Each of the first region 110 and the second region 120 may display a portion of a single image, sub-image, some combination thereof, or the like. For example, in some example embodiments illustrated in FIG. 2, the first and second regions 110 and 120 are displaying separate portions of a single sub-image that is a portion of the image collectively displayed by the unit display panels 11-1 to 11-N of the multivision apparatus 10.

In some example embodiments, a plurality of unit display panels 11-1 to 11-N are disposed contiguously as illustrated in FIG. 1, such that two or more unit display panels 11-1 to 11-N are in a continuous configuration ("arrangement"). If and/or when two or more unit display panels 11-1 to 11-N are in a continuous configuration, the second region 120 and one of the first regions 110 disposed adjacently thereto may be included in a single, common display panel. In some example embodiments, including some example embodiments illustrated in FIG. 2, the second region 120 of a unit display panel 11-N may surround the first region 110 of the unit display panel 11-N.

As shown in some example embodiments illustrated in FIGS. 2-3, the first region 110 may be disposed in a central region of the unit display panel 11-N. The first region 110 may include a plurality of first pixels MPA. As shown in some example embodiments illustrated in FIG. 3, the plurality of first pixels MPA may be disposed in rows and columns. For example, as shown in FIG. 3, the plurality of first pixels MPA may be disposed in a matrix array. The first region 110 may include one of a liquid crystal display (LCD), an organic light emitting diode (OLED) display, and a laser display.

As shown in some example embodiments illustrated in FIG. 3, the second region 120 may be disposed to be adjacent to the first region 110. As shown in some example embodiments illustrated in FIG. 3, the second region 120 may include a plurality of second pixels SPA may be disposed in a plurality of rows and in a plurality of columns. As shown in some example embodiments illustrated in FIG. 3, the plurality of rows and the plurality of columns in which the plurality of second pixels SPA are disposed may extend from the plurality of rows and the plurality of columns in which the plurality of first pixels MPA are disposed, such that at least some of the first pixels MPA and second pixels SPA are located within a common column and/or common row of a common matrix. Therefore, the first pixel MPA and the second pixel SPA may be disposed in the plurality of rows and columns at least partially comprising a common matrix.

The second region 120 may be disposed in a region of a unit display panel 11-N that is configured to not display an image. For example, the second region 120 may be located in a bezel region of the unit display panel 11-N. A region of a unit display panel 11-N that is configured to not display an image may be located in one or more edge regions of the unit display panel 11-N. In some example embodiments, the second region 120 may be disposed to be adjacent to the first region 110 along an edge of the screen portion 100 of the unit display panel 11-N. In some example embodiments, the second region 120 may have an area smaller than that of the first region 110, and may be disposed to at least partially surround the first region 110. The plurality of second pixels SPA included in the second region 120 may have a structure different from the structure of the plurality of first pixels MPA included in the first region 110. In some example embodiments, the first pixel MPA and the second pixel SPA have different structures. In other words, each of the first pixel MPA and the second pixel SPA may include displays having different respective physical circuit structures. For example, each of the first region 110 and the second region 120 may be a separate one of an LCD, an OLED display, a laser display, and a light emitting diode (LED) display.

In some example embodiments, in a unit display panel 11-N in which the first region 110 includes the LCD, the first region 110 may include a thin film transistor (TFT) substrate and a color filter substrate, facing each other, a liquid crystal layer disposed therebetween, a backlight unit disposed below the TFT substrate, and the like. Therefore, each of the plurality of first pixels MPA may have a structure including a pixel circuit disposed above the TFT substrate, the liquid crystal layer and the color filter substrate, disposed thereon, the backlight unit acting as a light source, in the TFT substrate, and the like.

In some example embodiments, the second region 120 may be provided as a display including a plurality of light emitting diodes (LEDs). In other words, each of the second pixels SPA may include the plurality of LEDs disposed in at least one or more rows or in at least one or more columns, a circuit to drive a single LED, and the like. Therefore, the second pixel SPA may have a physical circuit structure different from that of the first pixel MPA including the backlight unit acting as a light source, the liquid crystal layer to control luminance emitted by the backlight unit, and the like.

Figure 7A:
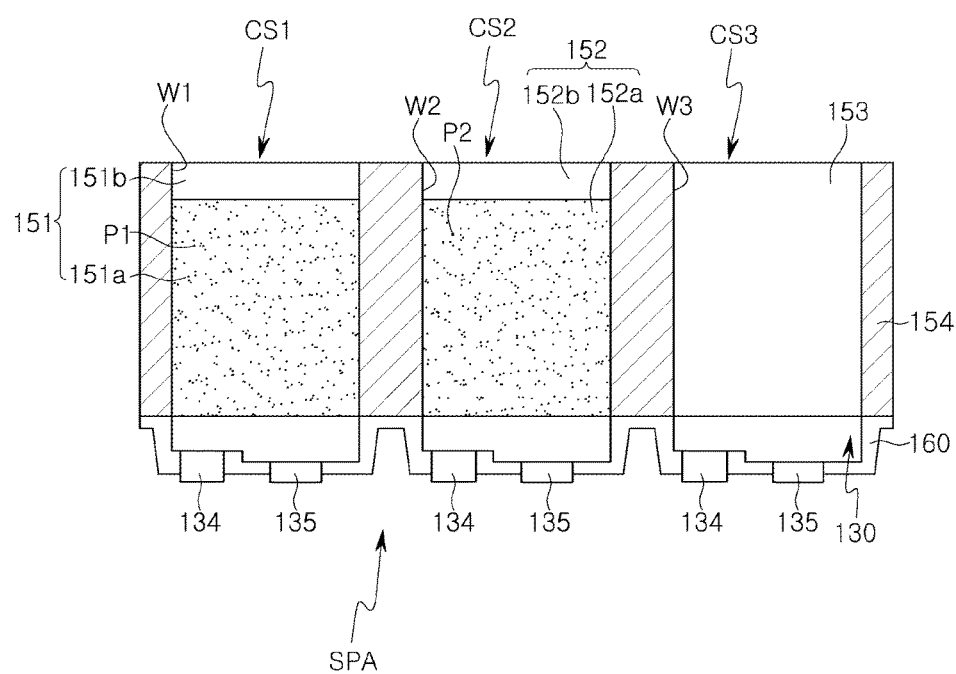
FIG. 7A is a side cross-sectional view taken along line VIIA-VIIA' of a unit display panel illustrated in FIG. 4.

With reference to FIGS. 4 and 7A, each of a plurality of second pixels SPA may include at least one of first to third LED cells CS1, CS2, and CS3, while the first to third LED cells CS1, CS2, and CS3 may be configured to emit red light (light having a wavelength between about 620 nm and about 740 nm), green light (light having a wavelength between about 495 nm and about 570 nm), and blue light (light having a wavelength between about 450 nm and about 495 nm), respectively.

A partition wall 154 may be disposed around the first to third LED cells CS1, CS2, and CS3 so that there may be no interference between light emitted by each LED cell CS1, CS2, and CS3. The partition wall 154 may include a light blocking material, for example a black matrix resin. A color of the black matrix resin is not limited to black. In some example embodiments, different colors of matrix resins, such as a white matrix resin, a green matrix resin, or the like, may be used depending on an application of a product, or the like. In some example embodiments, a matrix resin including a transparent resin may be used according to need. The white matrix resin may further include a reflective material or a scattering material. The black matrix resin may include at least one among a material, such as a polymer including a resin, a ceramic, a semiconductor, or a metal.

The partition wall 154 may be disposed to have a uniform or substantially uniform (e.g., uniform within manufacturing and/or material tolerances) thickness in such a mariner that a distance d1 between the first to third LED cells CS1, CS2, and CS3 of the second pixel SPA is uniform or substantially uniform (e.g., uniform within manufacturing and/or material tolerances). In some example embodiments, a distance d2 and a distance d4 in an edge of the second pixel SPA may be formed to have a thickness equal to about half of the distance d1 between the first to third LED cells CS1, CS2, and CS3 in the partition wall 154. A distance between the first to third LED cells CS1, CS2, and CS3 disposed in the plurality of second pixels SPA disposed adjacently thereto may be uniform or substantially uniform (e.g., uniform within manufacturing and/or material tolerances). In some example embodiments, the distance between the first to third LED cells CS1, CS2, and CS3 in a second region 120 may be equal or substantially equal (e.g., equal within manufacturing and/or material tolerances) to the distance between first to third sub pixels CM1, CM2, and CM3 of the first pixel MPA comprising a first region 110. Therefore, an entirety of the distance between the first to third LED cells CS1, CS2, and CS3 in the second region 120 and the first to third sub pixels CM1, CM2, and CM3 in the first region 110 may be uniform or substantially uniform (e.g., uniform within manufacturing and/or material tolerances).

With reference to a side cross-sectional view of the first region 110 and the second region 120, a detailed description of the first pixel MPA and the second pixel SPA will be provided. FIG. 6 is a side cross-sectional view taken along line VI-VI' of the unit display panel illustrated in FIG. 3.

With reference to FIG. 6, the first region 110 in some example embodiments may be formed of an LCD, and may include a TFT substrate 162, a color filter substrate 165 facing the TFT substrate 162, and a liquid crystal layer 163 disposed between the TFT substrate 162 and the color filter substrate 165. A first polarizing plate 161 may be disposed below the TFT substrate 162, and a second polarizing plate 166 may be disposed on the color filter substrate 165. In some example embodiments, a backlight unit 150 may be disposed below the first polarizing plate 161.

In some example embodiments, the liquid crystal layer 163 may display an image in such a mariner that a pattern of transmitted light emitted by the backlight unit 150 is changed according to an electrical stimulus provided to a liquid crystal material at least partially comprising the liquid crystal layer 163.

In some example embodiments, the TFT substrate 162 may include a plurality of gate lines formed to have a matrix shape and a plurality of data lines. A pixel electrode and a TFT may be formed in each position in which the plurality of gate lines intersect the plurality of data lines. A signal voltage applied through the TFT may be applied to the liquid crystal layer 163 through a pixel electrode, while the liquid crystal layer 163 may be configured to control light transmittance associated with the liquid crystal layer 163, based on the applied signal voltage.

Referring to FIG. 5A and FIG. 6, the TFT substrate 162 may include a plurality of first pixel circuits MPAC. One or more of the first pixel circuits MPAC may be configured to operate one or more of the first pixels MPA. The number ("quantity") of first pixel circuits MPAC may be equal to the number ("quantity") of sub pixels CM1, CM2, and CM3, such that the first pixel circuits MPAC are configured to control separate ones of the first to third sub pixels CM1, CM2, and CM3, at least partially comprising the first pixel MPA.

With reference to FIG. 5A, the first pixel circuit MPAC may include a switching device TR1 in which a gate line GL and a data line DL of the TFT substrate 162 are connected to a gate electrode and a source electrode, respectively. The switching device TR1 may be a transistor, while a pixel capacitor Cp (e.g., "capacitance device") may be connected to a drain electrode of the switching device TR1. The pixel capacitor Cp may include a storage capacitor. In the case of an LCD device, the pixel capacitor Cp may further include a liquid crystal capacitor. In some example embodiments, if and/or when the first region 110 includes an OLED, the pixel capacitor Cp may be used as a current source to supply a current to an organic electroluminescence device included in each pixel. In some example embodiments, the first pixel circuit MPAC may be formed to have a shape different from the shape illustrated in FIG. 5A.

In some example embodiments, the color filter substrate 165 may be disposed to oppose the TFT substrate 162. In some example embodiments the color filter substrate 162 may include a color filter including red, green, and blue (RGB) pixels 165a, 165b, and 165c each configured to produce a respective one of red light, green light, and blue light if and/or when light penetrates therethrough, and may include a transparent common electrode, including an indium tin oxide (ITO). A partition wall 165d may be disposed around the RGB pixels 165a, 165b, and 165c, and may include the black matrix resin.

The first polarizing plate 161 and the TFT substrate 162 may be extended to the second region 120.

The second region 120 is a region in which the plurality of second pixels SPA are disposed. The plurality of second pixels SPA may be mounted on a circuit board 170. The circuit board 170 may be disposed on a sealing portion 164 that seals or substantially seals (e.g., seals within manufacturing and/or material tolerances) the liquid crystal layer 163 in the first region 110.

With reference to FIG. 5B, the circuit board 170 may include a plurality of second pixel circuits SPAC each configured to operate one or more of the second pixels SPA. The second pixel circuits SPAC may be configured to each operate separate, respective ones of the second pixels SPA.

The second pixel circuit SPAC has a structure different from that of the first pixel circuit MPAC in FIG. 5A. For example, the second pixel circuit SPAC may include a power supply circuit PSC configured to supply power to the first to third LED cells CS1, CS2, and CS3, a driving circuit DC configured to control the switching on and off (e.g., selective activation) of the first to third LED cells CS1, CS2, and CS3, and a switching device TR2 in which the driving circuit DC and the first to third LED cells CS1, CS2, and CS3 are connected to a base electrode and a collector electrode, respectively. The switching device TR2 may be a transistor, while an emitter electrode of the switching device TR2 may be connected to a pixel resistance Rp. In some example embodiments, the second pixel circuit SPAC may be formed to have a shape different from the shape illustrated in FIG. 5B.

The plurality of second pixels SPA may be disposed in a region among LCD panels configured to not display an image (e.g., configured to be restricted from displaying an image, configured to be inhibited from displaying an image, etc.). In some example embodiments, the plurality of second pixels SPA may be disposed on the same layer as the color filter substrate 165 in the first region 110, and may be disposed in a region in which the black matrix resin of the color filter substrate 165 is removed in the region not displaying an image. In some example embodiments, the plurality of second pixels SPA may be on a top surface of sealing portion 164 and the color filter substrate 165 may be on a top surface of liquid crystal layer 163, where the top surfaces of the sealing portion 164 and the liquid crystal layer 163 are coplanar or substantially coplanar (e.g., coplanar within manufacturing and/or material tolerances). The top surfaces of the sealing portion 164 and the liquid crystal layer 163 may form a common, continuous layer surface, and the common, continuous layer surface may be a coplanar or substantially coplanar layer surface. As a result, the plurality of second pixels SPA and the color filter substrate 165 may be on a common, coplanar layer surface.

In some example embodiments, a top surface of the plurality of second pixels SPA may be disposed to have the same plane S as that of the color filter substrate 165, such that the top surfaces of the second pixels SPA and the top surface of the color filter substrate are coplanar or substantially coplanar (e.g., coplanar within manufacturing and/or material tolerances), so that each image displayed on the first pixel MPA and the second pixel SPA may form a single image without heterogeneity. Thus, in some example embodiments, the second pixels SPA and first pixels MPA may be configured to collectively display a continuous image across the first and second regions 110 and 120 of a unit display panel 11-N.

According to some example embodiments, a panel driving portion 140 configured to control one or more of the unit display panels 11-N may be disposed in a region in which the second region 120 overlaps the backlight unit 150. In some example embodiments, the panel driving portion 140 may be provided as a gate drive in panel (GIP). A protective layer 180 may be formed on the first pixel MPA and the second polarizing plate 166, so that the first pixel MPA, the second pixel SPA, and the second polarizing plate 166 may be protected from external impacts.

With reference to FIG. 7A, the second pixel SPA according to some example embodiments may include the first to third LED cells CS1, CS2, and CS3. First to third light control portions 151, 152, and 153 may be disposed on the first to third LED cells CS1, CS2, and CS3, while the partition wall 154 may be disposed among the first to third light control portions 151, 152, and 153. The first to third LED cells CS1, CS2, and CS3 are included in a single package so that a single pixel may have a single package. According to some example embodiments, each of the first to third LED cells CS1, CS2, and CS3 may be provided as a separate package. In some example embodiments, a case in which the first to third LED cells CS1, CS2, and CS3 are included in a single package will be described by way of example.

An LED 130 may include epitaxial layers, including a first conductive semiconductor layer, an active layer, and a second conductive semiconductor layer. The epitaxial layers may be grown on a single wafer using the same process. The active layer of the LED 130 may be configured to emit the same or substantially same (e.g., same within manufacturing and/or material tolerances) light. For example, the active layer may emit blue light (for example, light in a range of about 450 nm to 495 nm) and/or ultraviolet light (for example, light in a range of about 10 nm to 440 nm).

Figure 8A:
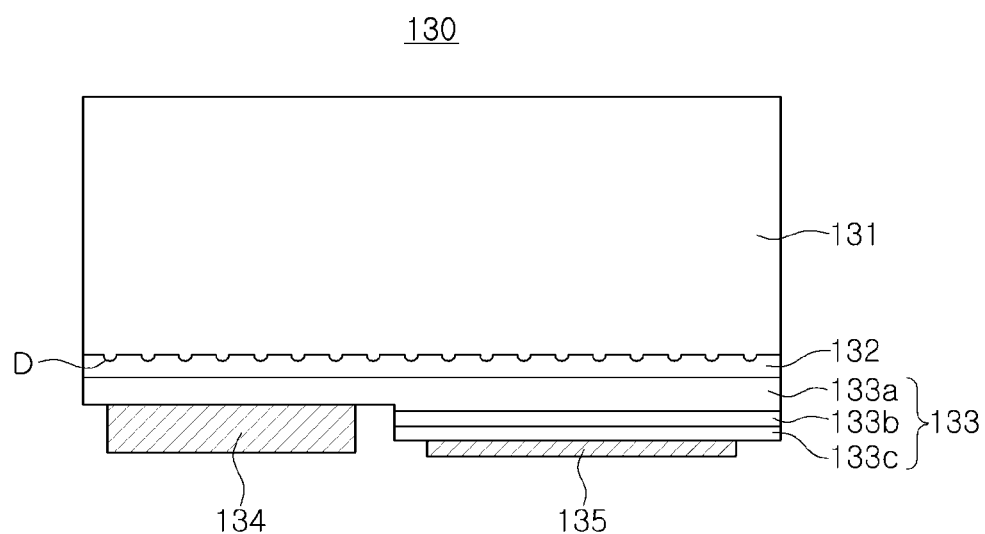
FIGS. 8A and 8B are cross-sectional views of a light emitting diode (LED) having various structures employable in some example embodiments of the present inventive concepts.
Figure 8B:
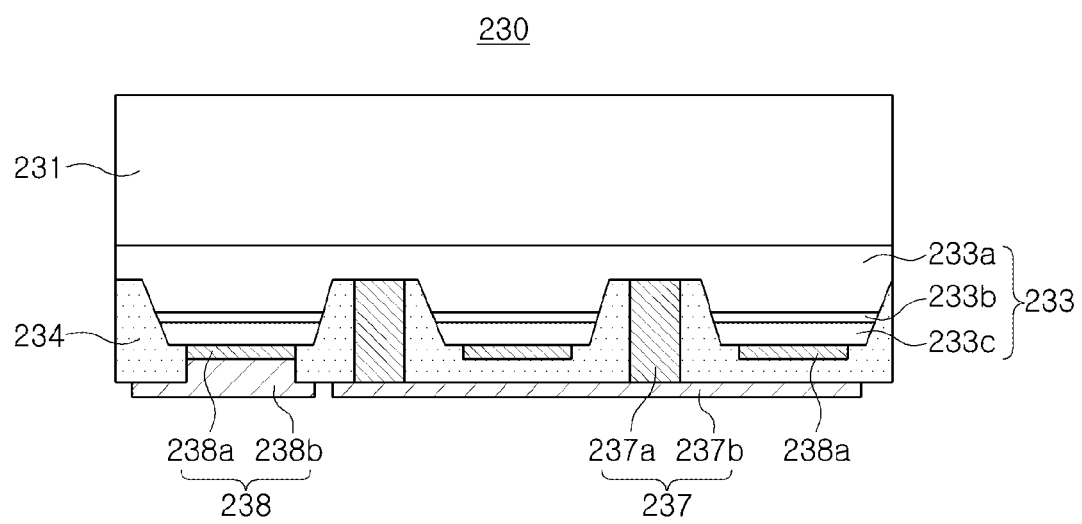

With reference to FIGS. 8A and 8B, a detailed description of an LED 130 will be provided. FIGS. 8A and 8B are cross-sectional views of a light emitting diode (LED) having various structures employable in some example embodiments of the present inventive concepts.

The LED 130 illustrated in FIG. 8A may include a light transmissive substrate 131 and a light emitting structure 133 disposed on the light transmissive substrate 131.

The light transmissive substrate 131 may be provided as an insulating substrate, including a sapphire, but is not limited thereto. The light transmissive substrate 131 may be provided as a conductive substrate or a semiconductor substrate, guaranteeing light transmittance, as well as the insulating substrate. An unevenness pattern D may be formed on a surface of the light transmissive substrate 131. The unevenness pattern D may enhance light extraction efficiency, and may improve a quality of a single crystal being grown.

The light emitting structure 133 may include a first conductive semiconductor layer 133a, an active layer 133b, and a second conductive semiconductor layer 133c, disposed on the light transmissive substrate 131 in sequence. A buffer layer 132 may be disposed between the light transmissive substrate 131 and the first conductive semiconductor layer 133a.

The buffer layer 132 may be provided as $In_xAl_yGa_{1-x-y}N$ (023 x≤1, 0≤y≤1). For example, the buffer layer 132 may be provided as gallium nitride (GaN), aluminum nitride (AlN), aluminum gallium nitride (AlGaN), and indium gallium nitride (InGaN). According to need, the buffer layer 132 may be formed through a composition of a plurality of semiconductor layers or by gradually changing the composition of a semiconductor.

The first conductive semiconductor layer 133a may be provided as an n-type nitride semiconductor satisfying $In_xAl_yGa_{1-x-y}N$ (0≤x<1, 0≤x+y<1, 0<x+y<1). In some example embodiments, an n-type impurity may be provided as silicon (Si). For example, the first conductive semiconductor layer 133a may include n-type GaN. The second conductive semiconductor layer 133c may be provided as a p-type nitride semiconductor layer satisfying $In_xAl_yGa_{1-x-y}N$ (0≤x<1, 0≤y<1, 0≤x+,y<1). In some example embodiments, a p-type impurity may be provided as magnesium (Mg). For example, the second conductive semiconductor layer 133c may be formed to have a single layer structure, but may have a multilayer structure having different compositions, as in some example embodiments. The active layer 133b may have a multiple quantum well (MQW) structure in which a MQW layer and a quantum barrier layer are alternately stacked. For example, the MQW and the quantum barrier layer may be provided as $In_xAl_yGa_{1-x-y}N$ (0≤x≤1, 0≤y≤1, 0≤x+y<1) having different compositions. In a specific example embodiment, the MQW may be provided as $In_xGa_{1-x}N$ (0<x≤1), while the quantum barrier layer may be provided as GaN or AlGaN. The active layer 133b is not limited to the MQW structure, but may have a single quantum well structure.

A first electrode 134 and a second electrode 135 may be disposed in a mesa-etched region of the first conductive semiconductor layer 133a and the second conductive semiconductor layer 133c, respectively, thereby being disposed on the same surface (a first surface). For example, the first electrode 134 may include at least one of aluminum (Al), gold (Au), chromium (Cr), nickel (Ni), titanium (Ti), and tin (Sn). The second electrode 135 may include a reflective metal. For example, the second electrode 135 may include a material, such as silver (Ag), Ni, Al, Cr, rhodium (Rh), palladium (Pd), iridium (Ir), ruthenium (Ru), Mg, zinc (Zn), platinum (Pt), Au, or the like, and may have a structure of a single layer or two layers or more.

An LED 230 illustrated in FIG. 8B includes a light emitting structure 233 disposed on a surface of a light transmissive substrate 231. The light emitting structure 233 may include the first conductive semiconductor layer 233a, an active layer 233b, and the second conductive semiconductor layer 233c.

The LED 230 includes a first electrode 237 and a second electrode 238, connected to the first conductive semiconductor layer 233a and the second conductive semiconductor layer 233c, respectively. The first electrode 237 may include a connection electrode 237a, such as a conductive via, penetrating through the second conductive semiconductor layer 233c and the active layer 233b to be connected to the first conductive semiconductor layer 233a, and may include a first electrode pad 237b connected to the connection electrode 237a.

The connection electrode 237a may be surrounded by an insulating portion 234 to be electrically separated from the active layer 233b and the second conductive semiconductor layer 233c. The connection electrode 237a may be disposed in a region in which the light emitting structure 233 is etched. In order to reduce contact resistance of the connection electrode 237a, the number, shape, and pitch thereof, a contact area with respect to the first conductive semiconductor layer 233a, and the like, may be designed appropriately. In some example embodiments, electric current flow may be improved in such a manner that the connection electrode 237a is disposed on the light emitting structure 233 in rows and columns. The second electrode 238 may include an ohmic contact layer 238a on the second conductive semiconductor layer 233c and a second electrode pad 238b.

The connection electrode 237a may have a single layer structure or a multilayer structure in which the first conductive semiconductor layer 233a has ohmic contact properties with respect to a conductive material, while the ohmic contact layer 238a may have a single layer structure or a multilayer structure in which the second conductive semiconductor layer 233c has ohmic contact properties with respect to a conductive material. For example, the connection electrode 237a and the ohmic contact layer 238a may be formed using a process of evaporating or sputtering one or more materials among Ag, Al, Ni, Cr, a transparent conductive oxide (TCO), and the like. The first electrode pad 237b and the second electrode pad 238b may be connected to the connection electrode 237a and the ohmic contact layer 238a, respectively, to function as an external terminal of the LED 230. For example, the first electrode pad 237b and the second electrode pad 238b may include Au, Ag, Al, Ti, tungsten (W), copper (Cu), tin (Sn), Ni, platinum (Pt), Cr, NiSn, TiW, AuSn or a eutectic metal thereof. For example, the insulating portion 234 may include a silicon oxide and a silicon nitride, such as $SiO_2$, $SiO_xN_y$, $Si_xN_y$, or the like. The insulating portion 234 may disperse a light reflective filler in a light transmissive material or introduce a distributed bragg reflector (DBR) structure in order to secure a high degree of reflectivity.

With reference to FIG. 7A, the second pixel SPA may include an encapsulation portion 160 encapsulating the LED 130 and allowing the first electrode 134 and the second electrode 135 to be exposed. The encapsulation portion 160 may have a high Young's modulus to strongly support the second pixel SPA. In some example embodiments, the encapsulation portion 160 may include a material having high thermal conductivity to effectively emit heat generated in the LED 130. For example, the encapsulation portion 160 may be provided as an epoxy resin or a silicone resin. In some example embodiments, the encapsulation portion 160 may include a light reflective particle to reflect light. Titanium dioxide (TiO$_2$) or aluminum oxide (Al$_2$O$_3$) may be used as the light reflective particle, but the light reflective particle is not limited thereto.

The partition wall 154 includes first to third light emitting windows W1, W2, and W3 in positions corresponding to the LED 130. The first to third light emitting windows W1, W2, and W3 may be provided as space to form the first to third light control portions 151, 152, and 153, respectively. The partition wall 154 may include a light blocking material to limit and/or prevent interference between light penetrating through the first to third light control portions 151, 152, and 153. For example, the partition wall 154 may include the black matrix resin.

The partition wall 154 is disposed to surround side surfaces of the first to third light control portions 151, 152, and 153 so that the first to third light control portions 151, 152, and 153 may be separated. The partition wall 154 may be disposed to be connected to the encapsulation portion 160. As such, the partition wall 154 and the encapsulation portion 160 may be provided to have a structure of being extended from space between the first to third light control portions 151, 152, and 153 to each space between the LEDs 130, thus effectively blocking light interference among the first to third LED cells CS1, CS2, and CS3 in the entirety of a path of light.

The first to third light control portions 151, 152, and 153 may control light emitted by the LED 130 to change into light having different colors. In some example embodiments, the first to third light control portions 151, 152, and 153 may be configured to provide red light, green light, and blue light, respectively.

In some example embodiments, the LED 130 is configured to emit blue light, and the first light control portion 151 and the second light control portion 152 may include a first wavelength conversion portion 151*a* and a second wavelength conversion portion 152*a* having a red phosphor P1 and a green phosphor P2, respectively. The first wavelength conversion portion 151*a* and the second wavelength conversion portion 152*a* may be formed in such a manner that a light transmissive liquid resin mixed with a wavelength conversion material, such as a red phosphor P1 or a green phosphor P2, is dispensed to the first light emitting window W1 and the second light emitting window W2. However, the first wavelength conversion portion 151*a* and the second wavelength conversion portion 152*a* may be formed using various other processes. For example, the first wavelength conversion portion 151*a* and the second wavelength conversion portion 152*a* may be provided as a wavelength conversion film. In some example embodiments, each of phosphor P1 and phosphor P2 may include one or more of a red phosphor, a green phosphor, and a blue phosphor, and LED 130 may be configured to emit light having one or more colors, including red light, green light, and blue light.

In some example embodiments, the first light control portion 151 and the second light control portion 152 may be disposed on the first wavelength conversion portion 151*a* and the second wavelength conversion portion 152*a*, and may further include light filter layers 151*b* and 152*b*, selectively blocking blue light. The first light emitting window W1 and the second light emitting window W2 may be configured to be restricted to emitting one of red light, green light, and blue light, according to the light filter layers 151*b* and 152*b*.

In some example embodiments, if and/or when the LED 130 emits blue light, the third light control portion 153 may not include a phosphor. Therefore, the third light control portion 153 may emit blue light, the same as blue light emitted by the LED 130.

The third light control portion 153 may be formed in such a manner that the light transmissive liquid resin not mixed with a phosphor is dispensed. According to some example embodiments, the third light control portion 153 may include a blue wavelength conversion material or a blue-green wavelength conversion material (for example, for wavelengths in a range of 480 nm to 520 nm) to control color coordinates of blue light. Since the wavelength conversion material is adopted to control the color coordinates of blue light provided by the third light control portion 153, the wavelength conversion material may include a lower phosphor content than that of the wavelength conversion material used in other wavelength conversion portions 151*a* and 152*a* to convert into other colors. In some example embodiments, the third light control portion 153 may include one or more of a red wavelength conversion material, a green wavelength conversion material, a red-green wavelength conversion material, and a red-blue wavelength conversion material.

FIG. 9 is a CIE 1931 color space chromaticity diagram illustrating a wavelength conversion material employable in a first light control portion 151 and a second light control portion 152 according to some example embodiments of the present inventive concepts.

With reference to the CIE 1931 color space chromaticity diagram illustrated in FIG. 9, white light generated by mixing yellow, green, and red phosphors with a blue light emitting device or by mixing a green light emitting device, a red light emitting device, and the blue light emitting device has two or more peak wavelengths, and may be disposed on a line connecting xy-coordinates (0.4476, 0.4074), (0.3484, 0.3516), (0.3101, 0.3162), (0.3128, 0.3292), and (0.3333, 0.3333) in the CIE 1931 color space chromaticity diagram. Alternatively, the white light may be disposed in a region surrounded by the line and a blackbody radiation spectrum. A color temperature of the white light is within a range of 2,000 K to 20,000 K. In FIG. 9, the white light in the vicinity of point E (0.3333, 0.3333) disposed below the blackbody radiation spectrum may be in a state in which a level of yellow light is relatively low, and may be used as a lighting light source in a region exhibiting a brighter or fresher feeling to the naked eye. Therefore, lighting products using the white light in the vicinity of point E (0.3333, 0.3333) disposed below the blackbody radiation spectrum may be highly effective as a lighting device for retail spaces in which consumer goods are offered for sale.

Various materials, such as the phosphor and/or a quantum dot (QD) may be used as a material to convert wavelength of light emitted by an LED adopted in some example embodiments.

The phosphors may have the following empirical formulas and colors.

Oxides: yellow and green Y$_3$Al5O$_{12}$:Ce, Tb$_3$Al$_5$O$_{12}$:Ce, Lu$_3$Al$_5$O$_{12}$:Ce Silicates: yellow and green (Ba,Sr)$_2$SiO$_4$:Eu, yellow and orange (Ba,Sr)$_3$SiO$_5$:Ce Nitrides: green β-SiAlON:Eu, yellow La$_3$Si$_6$N$_{11}$:Ce, orange α-SiAlON:Eu, red CaAlSiN$_3$:Eu, Sr$_2$Si$_5$N$_8$:Eu, SrSiAl$_4$N$_7$:Eu, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0≤y≤4) (where, Ln is at least one element selected from a group consisting of group IIIa elements and rare-earth elements, and M is at least one element selected from a group consisting of Ca, Ba, Sr and Mg)

Fluorides: KSF-based red $K_2SiF_6:Mn^{4+}$, $K_2TiF_6:Mn^{4+}$, $NaYF_4:Mn^{4+}$, $NaGdF_4:Mn^{4+}$ and $K_3SiF_7:Mn^{4+}$ Phosphor compositions should basically conform to stoichiometry, and respective elements may be substituted with other elements of respective groups of the periodic table. For example, strontium (Sr) may be substituted with barium (Ba), calcium (Ca), magnesium (Mg), and the like within the alkaline earth group (II), and yttrium (Y) may be substituted with lanthanum (La)-based elements, such as terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, in consideration of a desired energy level, and an activator may be applied alone, or with a co-activator, for modifying the characteristics of phosphors.

In detail, in order to enhance reliability at high temperatures and at high levels of humidity, a fluoride-based red phosphor may be coated with a fluoride not containing manganese (Mn), or may further include organic materials on a surface thereof or on a surface of the fluoride coating not containing Mn. Different from other phosphors, the fluoride-based red phosphor may implement a narrow full width at half maximum equal to or less than 40 nm, thus being used in a high resolution TV, such as a UHD TV.

Table 1 below represents types of phosphors in applications to be used for a blue LED (440 nm to 460 nm) or a UV LED (380 nm to 440 nm).

TABLE 1

| Application | Phosphor |
| --- | --- |
| LED TV BLU | $\beta$-SiAlON:$Eu^{2+}$, (Ca, Sr)AlSiN$_3$:$Eu^{2+}$, La$_3$Si$_6$N$_{11}$:$Ce^{3+}$, $K_2SiF_6$:$Mn^{4+}$, SrLiAl$_3$N$_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Lighting Device | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, $K_2SiF_6$:$Mn^{4+}$, SrLiAl$_3$N$_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Side Viewing (Mobile, Laptop PC) | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, $K_2SiF_6$:$Mn^{4+}$, SrLiAl$_3$N$_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Electronic Device (Headlamp, etc.) | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, $K_2SiF_6$:$Mn^{4+}$, SrLiAl$_3$N$_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |

In some example embodiments, a wavelength conversion portion may use wavelength conversion materials in such a manner that the phosphor is substituted with the wavelength conversion materials, or a QD is mixed with the phosphor.

Figure 7B:
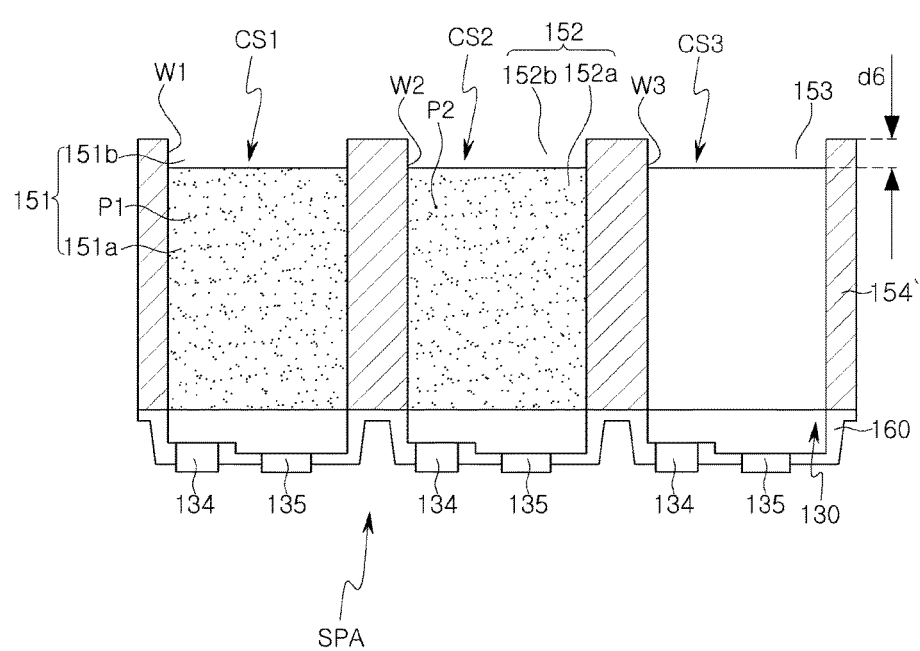
FIG. 7B is a modified example of the second pixel in FIG. 7A.

FIG. 7B illustrates a modified partition wall of a second pixel SPA according to some example embodiments. The second pixel SPA in FIG. 7B is different from the second pixel SPA in FIG. 7A in that a partition wall 154' is provided to have a thickness greater, by d6, than each thickness of first to third light control portions 151, 152, and 153. Other compositions are the same as the composition illustrated in FIG. 7A.

Since the partition wall 154' is disposed to have the thickness greater than each thickness of the first to third light control portions 151, 152, and 153, an irradiation angle of light emitted by the first to third light control portions 151, 152, and 153 may be narrower than that of some example embodiments above. Since a first region 110 and a second region 120 in some example embodiments are formed using heterogeneous displays, each of the irradiation angles of light emitted by a first pixel MPA and the second pixel SPA may be different. As such, if the irradiation angles of light emitted by the first region 110 and the second region 120 are different, distortion in which luminance or color of an image displayed in first and second regions of a display appears different from the actual image, depending on a location of a user viewing a display panel, may occur. In some example embodiments, the thickness of the partition wall 154' is formed to be greater, by d6, than each thickness of the first to third light control portions 151, 152, and 153, thus controlling the irradiation angles of light emitted by the first region and the second region to be uniform. Therefore, the image without distortion regardless of the location of the user viewing the display panel may be provided.

Figure 10:
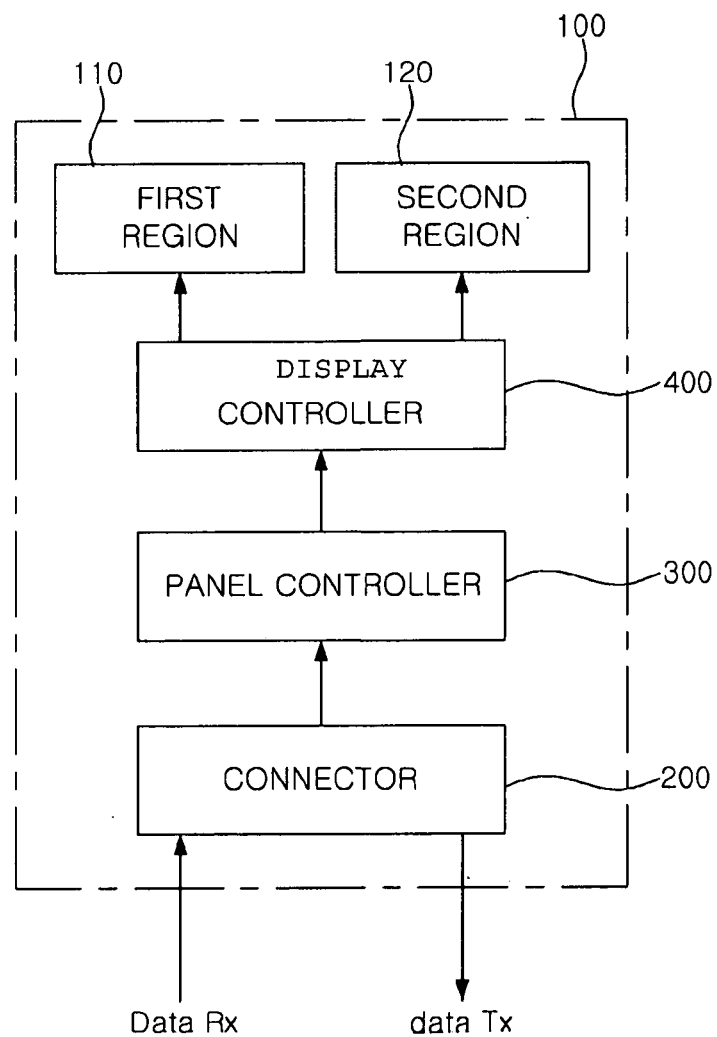
FIG. 10 is a block diagram illustrating a composition of a unit display panel according to some example embodiments.

FIG. 10 is a block diagram illustrating a composition of a unit display panel 11-N according to some example embodiments. The unit display panel 11-N illustrated in at least FIG. 10 may be any of the unit display panels 11-1 to 11-N included in the multivision apparatus 10, including unit display panel 11-1.

A unit display panel 11-N includes a screen portion 100, a display controller 400, a panel controller 300, and a connector 200. In some example embodiments, at least the display controller 400 and the panel controller 300 may be included in a common panel controller. The common panel controller may be configured to implement some or all elements of the panel controller 300 and the display controller 400.

At least one of the panel controller 300 and the display controller 400 may be implemented using hardware components, software components, or a combination thereof. For example, the hardware components may include microcontrollers, memory modules, sensors, amplifiers, band-pass filters, analog to digital converters, and processing devices, or the like. A processing device may be implemented using one or more hardware device(s) configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device(s) may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors, multi-core processors, distributed processing, or the like.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, and/or computer storage medium or device. The software also may be distributed over network coupled computer systems so that the software is stored and executed in a distributed fashion. The software and data may be stored by one or more computer readable recording mediums.

A memory may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM).

A processor may be, a central processing unit (CPU), a controller, or an application-specific integrated circuit (ASIC), that when, executing instructions stored in the memory, configures the processor as a special purpose computer to perform the operations of one or more of the panel controller 300 and the display controller 400.

As described above, the screen portion 100, also referred to herein as a display screen 100, may include multiple regions, and the screen portion 100 may be configured to display a single image in such a manner that the single image is divided into separate portions and the separate portions (sub-images) of the image are displayed by separate regions of the screen portion 100. In some example embodiments, the screen portion regions are configured to collectively display a sub-image of a larger image that may itself be collectively displayed by a plurality of unit display panels 11-1 to 11-N. In some example embodiments, the screen portion 100 may include a first region 110 and a second region 120, which are heterogeneous displays configured to display one or more images according to different operations.

The display controller 400, which may include one or more instances of circuitry, may include a calibration circuit configured to control a luminance value of an image signal transmitted to the first region 110 and the second region 120 in order to limit and/or prevent a difference in luminance of the image displayed in the first region 110 and the second region 120 due to a difference in operations of displaying the image in the first region 110 and the second region 120, respectively.

The panel controller 300 of the unit display panel 11-N may include one or more instances of circuitry. The panel controller 300 may include an individual image processor. The image processor may be configured to extract an image signal from an input image signal (data Rx) received at the unit display panel 11-N through the connector 200. The individual image processor may generate an image that may be displayed on the screen portion 100 of the unit display panel 11-N according to the extracted image signal, where the image may be a limited portion of a larger image (e.g., a sub-image). The individual image processor may transmit an image signal (data Tx) to a unit display panel 11-1 to 11-(N-1) disposed adjacently thereto the unit display panel 11-N in which the image processor is included, through the connector 200.

The panel controller 300 included the unit display panel 11-N may generate one or more images (e.g., sub-images) that may be displayed by one or more adjacent unit display panels 11-1 to 11-(N-1) in the multivision apparatus 10. To this end, the panel controller 300 in unit display panel 11-N may be configured to determine the configuration ("arrangement," "structure," etc.) of the array of interconnected unit display panels 11-1 to 11-N in the multivision apparatus 10, such that the panel controller 300 determines the relative location of each unit display panel 11-1 to 11-N in the array. The panel controller 300 may determine the configuration based on accessing a stored representation of the configuration. Such a representation may be stored locally to the unit display panel 11-N. The panel controller 300 may determine the configuration based on communicating with one or more panel controllers 300 of at least one or more unit display panels 11-1 to 11-(N-1) disposed adjacently to the unit display panel 11-N in the multivision apparatus 10, one or more unit display panels 11-1 to 11-(N-1) that are non-adjacent to the unit display panel 11-N in the multivision apparatus 10, some combination thereof, or the like. In some example embodiments, a panel controller 300 may map a received input image signal onto each unit display panel 11-1 to 11-N of the array thereof included in the multivision apparatus 10, where the input image signal includes information associated with an image to be displayed by the multivision apparatus 10.

One or more of the panel controllers 300 of the unit display panels 11-1 to 11-N may associate separate portions of the image (e.g., sub-images) with separate unit display panels 11-1 to 11-N in the array of the multivision apparatus 10. The one or more panel controllers 300 may divide the image into separate sub-images that are associated with separate, respective unit display panels 11-1 to 11-N in the multivision apparatus, based on the configuration of the unit display panels 11-1 to 11-N in the multivision apparatus 10. The one or more panel controllers 300 may generate image data that indicates at least one sub-image of the image and a unit display panel 11-1 to 11-N associated with each sub-image of the at least one sub-image.

The one or more panel controllers 300 may distribute the image data to one or more of the unit display panels 11-1 to 11-N. The one or more panel controllers 300 may thus cause the image data to be distributed at least partially through the array to at least some of the unit display panels 11-1 to 11-N. For example, at least one panel controller 300 of a given unit display panel 11-N may transmit the image data at least one adjacent unit display panel 11-(N-1) to cause the at least one adjacent unit display panel 11-(N-1) to distribute the image data to at least one additional unit display panel 11-(N-2) in the array, etc. As a result, the image data may be distributed through an entirety of the array to each of the unit display panels 11-1 to 11-N, to cause the unit display panels 11-1 to 11-N to each display a separate, respective sub-image that is associated therewith, such that the unit display panels 11-1 to 11-N collectively display the image. In some example embodiments, a separate hub that is configured to distribute separate sub-images of an image displayed in the unit display panels 11-1 to 11-N of the multivision apparatus 10 to the respective corresponding unit display panels 11-1 to 11-N may be absent from the multivision apparatus 10. A general multivision apparatus 10 may process an image displayed in the unit display panel 11-1 to 11-N in a separate control device to be distributed to each unit display panel 11-1 to 11-N through the hub. In some example embodiments, where the multivision apparatus 10 extracts the image signal from the panel controller 300 of each unit display panel 11-1 to 11-N, the separate control device or hub is absent from the multivision apparatus 10.

Figure 11:
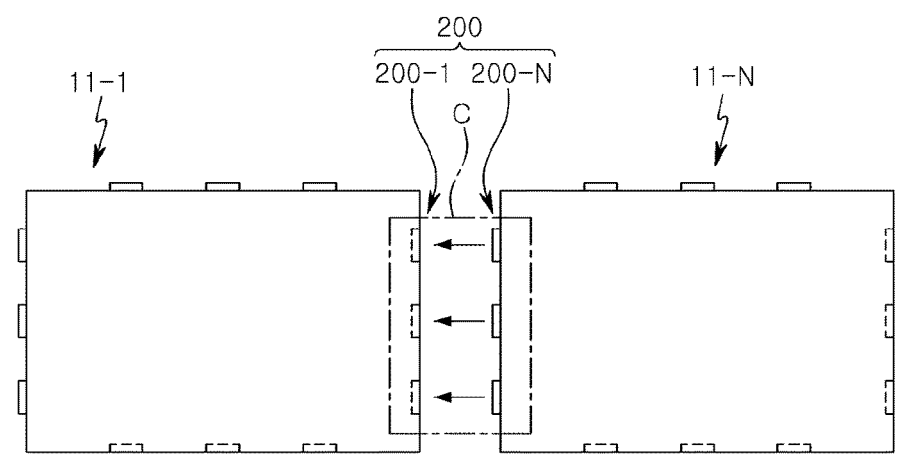
FIG. 11 is a view illustrating a process of configuring a multivision apparatus in such a manner that unit display panels are combined according to some example embodiments.
Figure 12A:
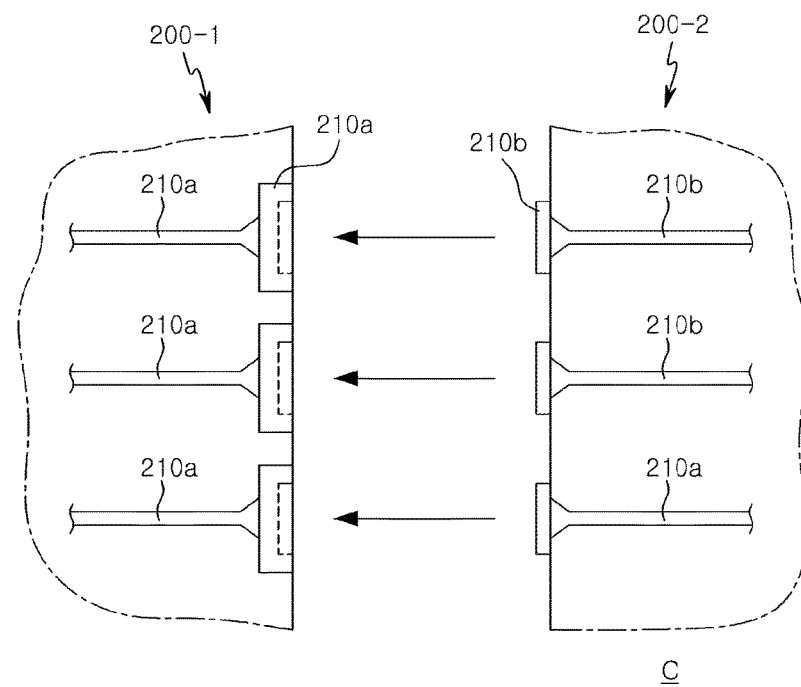
FIGS. 12A and 12B are views illustrating a process of connecting connectors in FIG. 11.
Figure 12B:
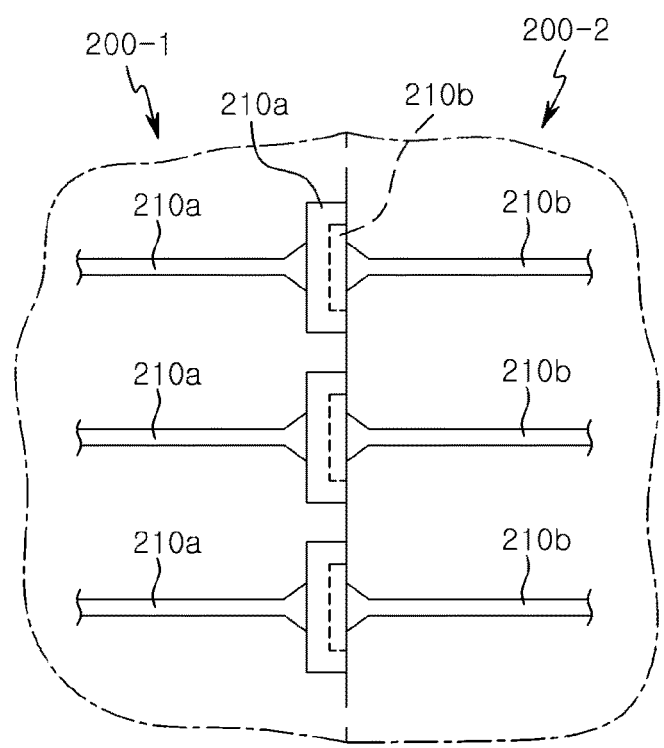

The connector 200 may receive and transmit image signals (data Rx and data Tx) at the given unit display panel 11-N. The connector 200 may be a magnetic connector. In some example embodiments, each of the plurality of unit display panels 11-1 to 11-N of the multivision apparatus 10 may be connected through magnetic force of the magnetic connectors of adjacent unit display panels 11-1 to 11-N. With reference to FIGS. 11, 12A, and 12B, a detailed description thereof will be provided.

As illustrated in FIG. 11, a unit display panel 11-1 may be connected to a unit display panel 11-N disposed adjacently thereto through connectors 200 disposed on one or more side surface thereof, respectively, such that the unit display panels 11-1 and 11-N are interconnected. With reference to FIG. 11 and FIG. 12A, a connector 200 may include one or more of a connector 200-1 that includes one or more female connectors 210a' and a connector 200-2 that includes one or more male connectors 210b. As shown in FIG. 11 and FIG. 12A, for example, unit display panel 11-1 may include a connector 200-1 that includes three female connectors 210a' and unit display panel 11-N may include a connector 200-2 that includes three male connectors 210b. The female connector 210a' and the male connector 210b' may be formed of magnets having different polarities. In some example embodiments, one of the female connector 210a' and the male connector 210b' may be provided as a magnet, while the other may be formed of a metal attached to the magnet. Therefore, as illustrated in FIG. 12A, in some example embodiments, where the female connector 210a' and the male connector 210b' are disposed adjacently to each other (e.g., when connectors 200-1 and 200-2 are disposed adjacently to each other), the female connector 210a' and the male connector 210b' may be attracted to each other through magnetic force to be connected, as illustrated in FIG. 12B, such that connectors 200-1 and 200-2 are connected to each other. A connector 200 of a given unit display panel 11-1 to 11-N may include a terminal configured to transmit and/or receive an image signal, and may include a power supply terminal configured to supply electrical power to the given unit display panel 11-1 to 11-N according to some example embodiments. Therefore, if and/or when cables 210a and 210b configured to transmit and/or receive the image signal or power are extended to the female connector 210a' and the male connector 210b', respectively, an image signal and/or electrical power may be transmitted and/or received between the unit display panel 11-1 and the unit display panel 11-N, connected through the connectors 200-1 and 220-N thereof.

Figure 13:
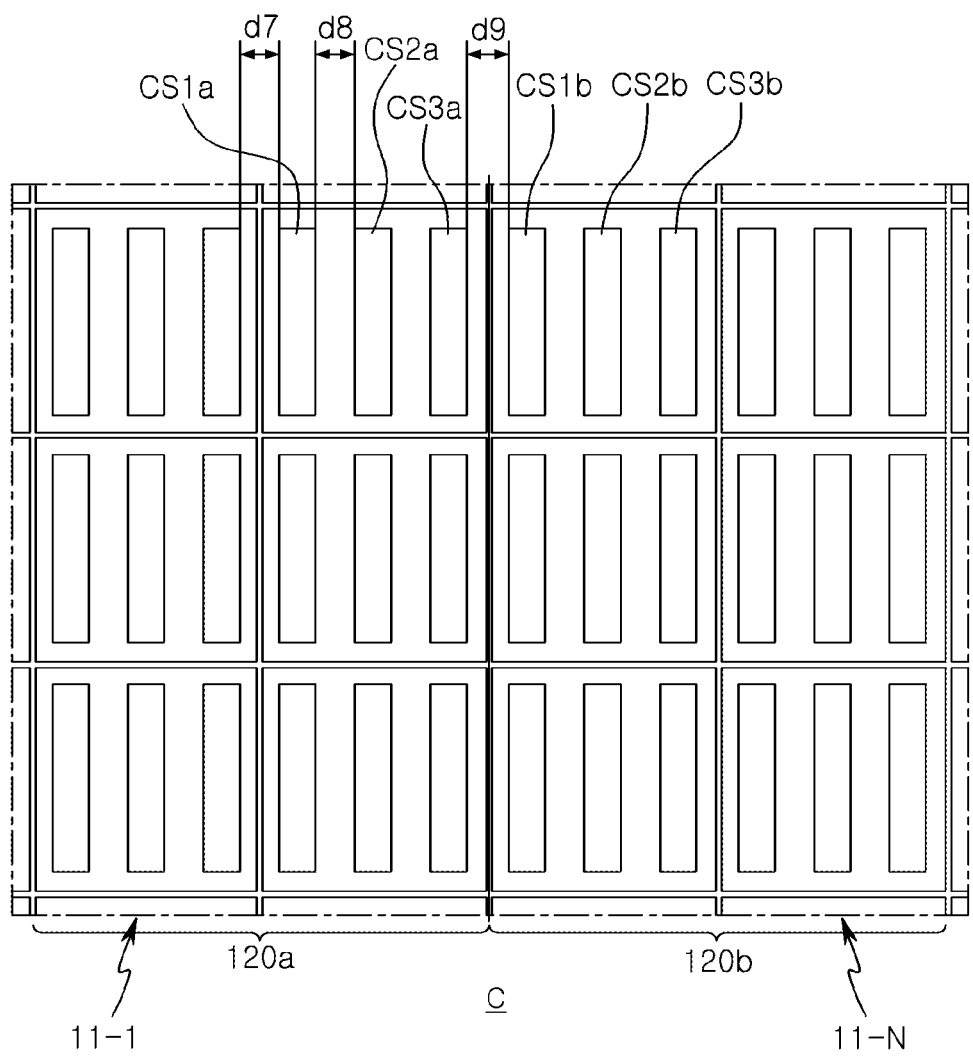
FIG. 13 is a view of a pixel array of a multivision apparatus configured in such a manner that unit display panels are combined according to some example embodiments.

FIG. 13 is a view of a disposition of second pixels SPAa and SPAb configuring second regions 120a and 120b of unit display panels 11-1 and 11-N, in a case in which a female connector 210a' is connected to a male connector 210b, as illustrated in FIG. 12B. A row and a column in which a second pixel SPAa of a unit display panel 11-1 have the same array as those of a second pixel SPAb of a different unit display panel 11-N disposed adjacently thereto. Distances d7 and d8 among first to third LED cells CS1a, CS2a, and CS3a, configuring the second pixel of the unit display panel 11-1 and a distance d9 between the third LED cell CS3a and a first LED cell CS1b of the unit display panel 11-N disposed adjacently thereto may be the same. Therefore, in a case in which the female connector 210a' is connected to the male connector 210b, pixels of the unit display panels 11-1 and 11-N disposed adjacently thereto are disposed in the same rows and columns, so that separate, adjacent sub-images of an image connected at an interface between the unit display panel 11-1 and the unit display panel 11-N, where the separate sub-images are displayed by separate ones of the unit display panel 11-1 and 11-N, may be collectively displayed by the unit display panels 11-1 and 11-N without heterogeneity between the separate, adjacent sub-images.

Accordingly, the array of unit display panels 11-1 to 11-N may collectively display an image on the multivision display screen 90, based on each unit display panel 11-1 to 11-N displaying a separate sub-image of the image, such that a boundary between the separate, adjacent sub-images is seamless or substantially seamless (e.g., seamless within manufacturing and/or material tolerances). In other words, the array of unit display panels 11-1 to 11-N may collectively display an image on the multivision display screen 90, based on each unit display panel 11-1 to 11-N displaying a separate sub-image of the image, such that the displayed image is continuous or substantially continuous across the screen portions of the array of unit display panels 11-1 to 11-N.

As a result, in some example embodiments, the separate unit display panels 11-1 to 11-N may collectively display an image that includes an array of sub-images, each sub-image displayed on a separate unit display panel 11-1 to 11-N, where the array of sub-images seamlessly or substantially seamlessly form a display of the image.

A seamless or substantially seamless (e.g., without heterogeneity) display of an image may refer to a display of the separate sub-images of the image in separate unit display panels 11-1 to 11-N of the multivision apparatus, where the image is continuous or substantially continuous between adjacent sub-images displayed on separate, adjacent unit display panels 11-1 to 11-N.

Figure 14:
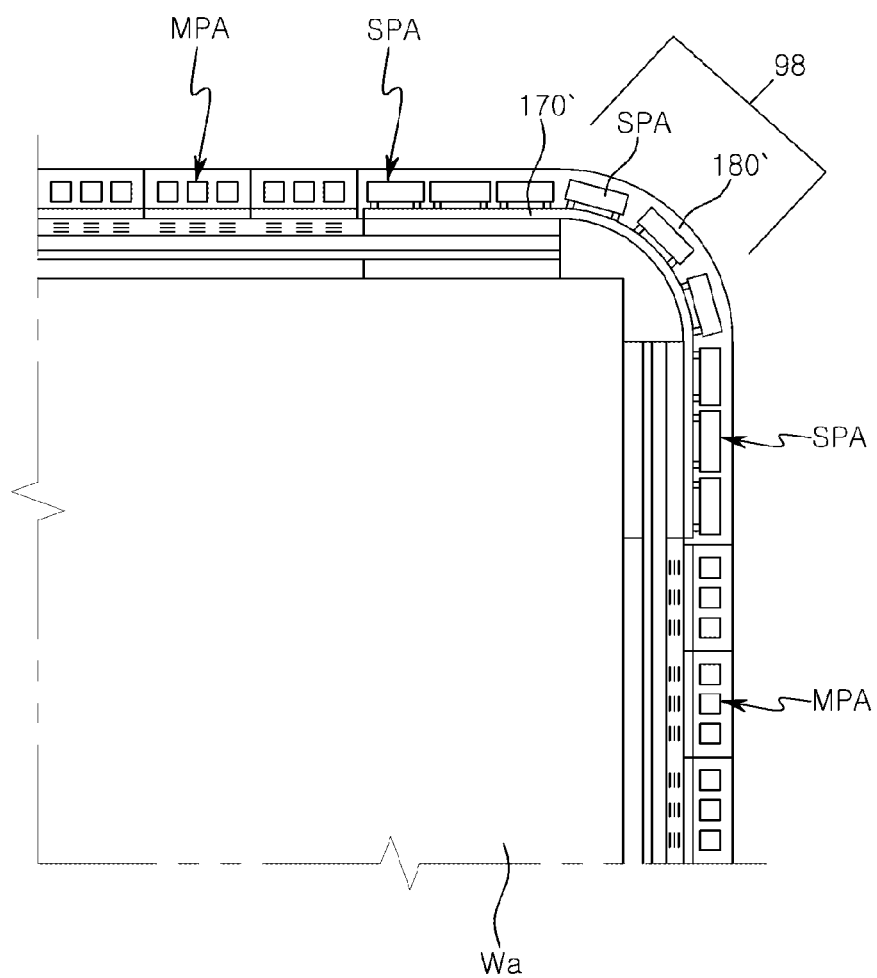
FIG. 14 is a side cross-sectional view of a unit display device according to some example embodiments.

FIG. 14 is a side cross-sectional view of a multivision apparatus 20 according to some example embodiments. In some example embodiments, the multivision apparatus 20 includes a circuit board 170' of a unit display panel 21 that is extended to a different display panel 22. Since other compositions thereof are the same as those of a display panel in FIG. 6 described above, repeated descriptions will be omitted.

The circuit board 170' may be formed of a flexible circuit board. In some example embodiments, the circuit board 170' may be disposed to protrude on a side surface of unit display panels 21 and 22, thus flexibly connecting the unit display panel 21 to the unit display panel 22, disposed adjacently. As a result, and as shown in FIG. 14, the unit display panels 21 and 22 may collectively form a multivision display screen 90 that includes a curved screen portion 98.

In some example embodiments, a protective layer 180' including a flexible material may be disposed on a surface of the circuit board 170'. Therefore, in a manner different from some example embodiments described above, in which unit display panels are disposed contiguously on the same surface, a plurality of unit display panels 21 and 22 may be disposed on different surfaces, in some example embodiments. For example, each of the unit display panels 21 and 22 may be disposed on each surface of a wall Wa. Therefore, since the multivision apparatus 20 in some example embodiments may seamlessly cover each surface of the wall Wa, an image displayed in a display panel may be seamlessly (e.g., without heterogeneity) displayed in a corner of the wall Wa.

Figure 15:
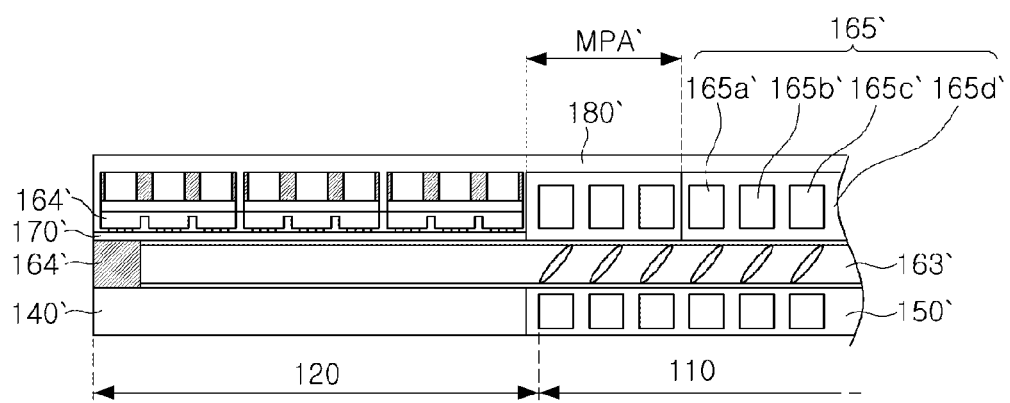
FIG. 15 is a side cross-sectional view of a unit display panel according to some example embodiments.

FIG. 15 is a side cross-sectional view of a unit display panel according to some example embodiments. Compared with a display panel in FIG. 6 described above, the unit display panel in some example embodiments has a difference in that a display panel configuring a first region 110' is provided as an OLED display. Since other compositions thereof are the same as those of the display panel in FIG. 6 described above, repeated descriptions will be omitted.

The first region 110' of some example embodiments may include the OLED display, and may include a TFT substrate 150', a color filter substrate 165' facing the TFT substrate 150', and an organic emission layer 163' disposed between the TFT substrate 150' and the color filter substrate 165'. The organic emission layer 163' may be formed in such a manner that an organic emission material is inserted between a pair of substrates, and a sealing portion 164' is formed in an end portion of the pair of substrates. The organic emission layer 163' may be extended to a second region 120'.

For example, the color filter substrate 165' may be disposed to oppose the TFT substrate 150'. In some example embodiments, the color filter substrate 165' may include a color filter including RGB pixels 165a', 165b', and 165c' producing colors when light penetrates therethrough, and may include a transparent common electrode, such as an ITO. A partition wall 165d' may be disposed around the RGB pixels 165a', 165b', and 165c', and may include a black matrix resin.

The second region 120' is provided as a region in which a plurality of second pixels including an LED device are disposed, and may include a circuit substrate 170' on which the plurality of second pixels are mounted. The circuit substrate 170' may be disposed on the sealing portion 164' sealing the organic emission layer 163' of the first region 110'. A plurality of second pixels SPA' may be disposed in a region in which a region not displaying an image (a bezel region) is removed, among OLED displays. A plurality of second pixels may be disposed on the same layer as the color filter substrate 165' of the first region 110'. A top surface of the plurality of second pixels SPA' may be disposed to be coplanar with the color filter substrate 165, so that the separate images displayed on the first pixel MPA' and the second pixel may collectively form a single image without heterogeneity (e.g., seamlessly or substantially seamlessly form a continuous or substantially continuous image). According to some example embodiments, a panel driving portion 140' configured to control the unit display panel may be disposed in a region in which the second region 120' is in contact with the TFT substrate 150'. In some example embodiments, the panel driving portion 140' may be provided as a GIP.

FIGS. 16, 17, 18, and 19 are side cross-sectional views of a process of manufacturing a unit display panel in FIG. 6.

Figure 16:
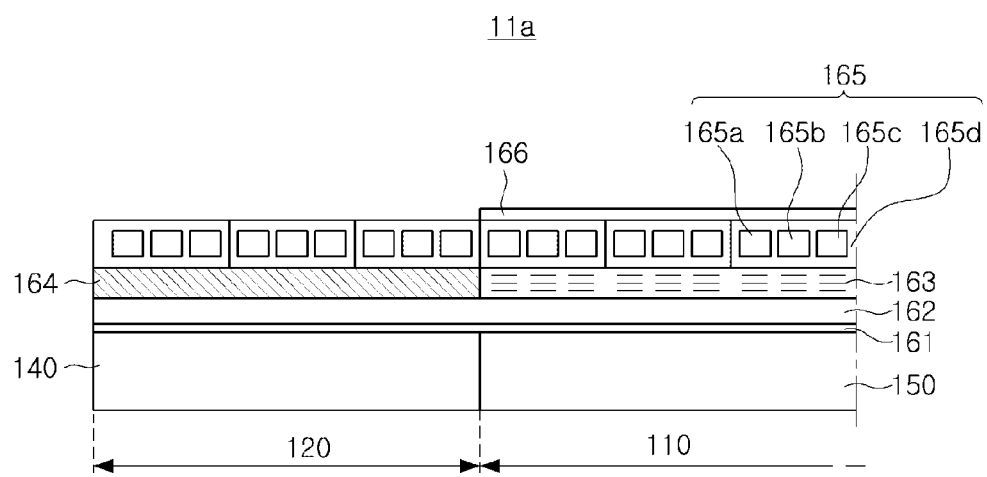
FIG. 16 is a side cross-sectional view of a process of manufacturing a unit display panel in FIG. 6.

First, an LCD display panel 11a is disposed, as illustrated in FIG. 16.

The LCD display panel 11a of some example embodiments may include a TFT substrate 162, a color filter substrate 165 facing the TFT substrate 162, and a liquid crystal layer 163 disposed between the TFT substrate 162 and the color filter substrate 165. An end portion of the liquid crystal layer 163 may be sealed with a sealing portion 164.

A first polarizing plate 161 may be disposed below the TFT substrate 162, while a second polarizing plate 166 may be disposed on the color filter substrate 165. In some example embodiments, a panel driving portion 140 and a backlight unit 150 may be disposed below the first polarizing plate 161.

Figure 17:
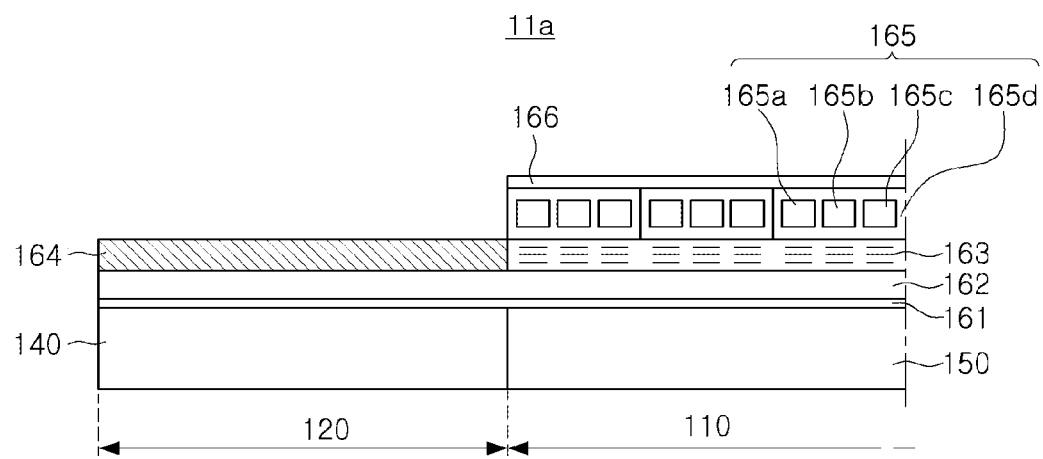
FIG. 17 is a side cross-sectional view of a process of manufacturing a unit display panel in FIG. 6.

Subsequently, as illustrated in FIG. 17, the sealing portion 164 disposed below the color filter substrate 165 may be exposed in such a manner that a region disposed in a second region 120 among the color filter substrate 165 is removed.

Figure 18:
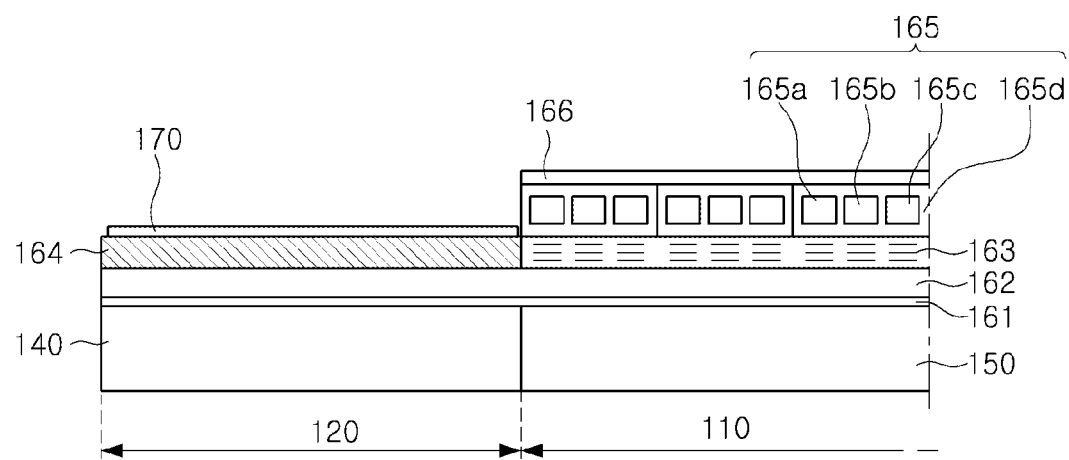
FIG. 18 is a side cross-sectional view of a process of manufacturing a unit display panel in FIG. 6.
Figure 19:
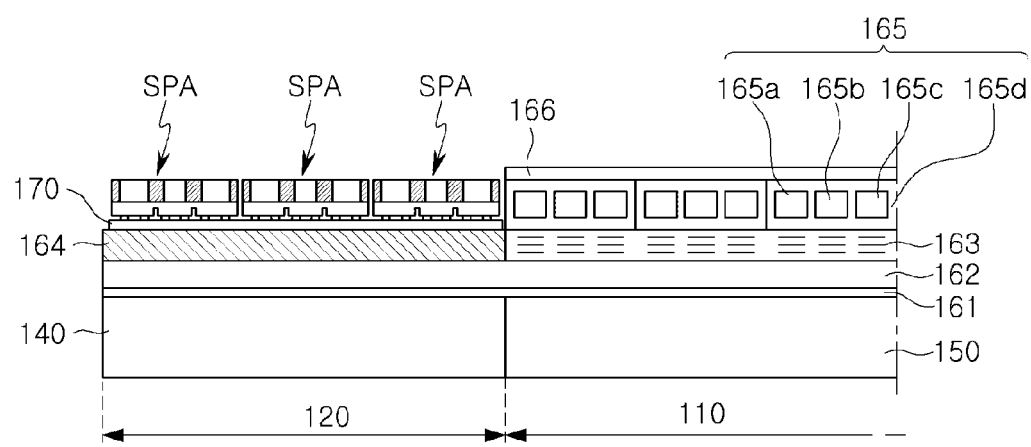
FIG. 19 is a side cross-sectional view of a process of manufacturing a unit display panel in FIG. 6.

Subsequently, as illustrated in FIG. 18, a circuit substrate 170 is disposed on the sealing portion 164, and a plurality of second pixels SPA may be mounted on the circuit board 170, as illustrated in FIG. 19. According to some example embodiments, the plurality of second pixels SPA may be disposed after being mounted on the circuit board 170.

Subsequently, a protective layer is formed to cover a plurality of first pixels SPA and the second polarizing plate 166, and a unit display panel 11-1 to 11-N in FIG. 6 may be manufactured.

Figure 20:
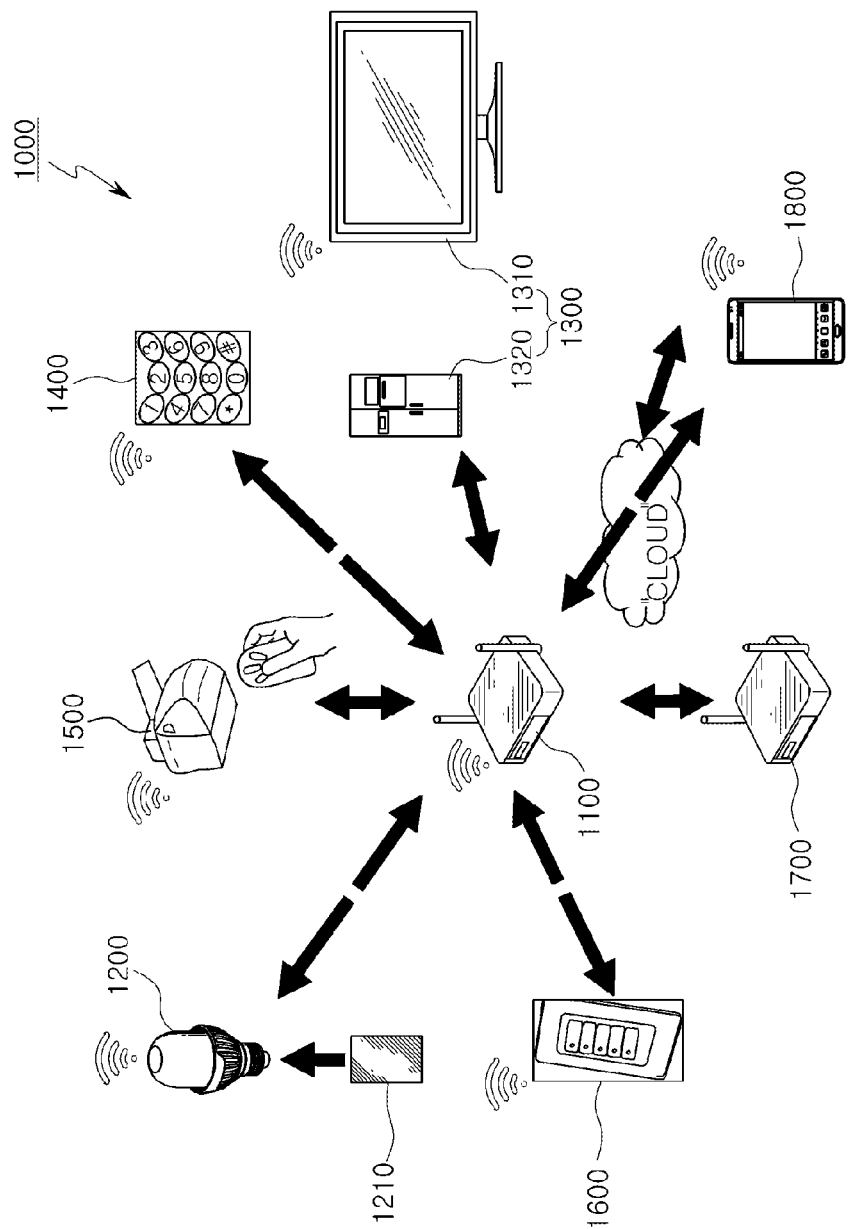
FIG. 20 is an indoor network system employing a display panel according to some example embodiments of the present inventive concepts.

FIG. 20 is an indoor smart network system employing a display panel according to some example embodiments of the present inventive concepts.

A network system 1000 according to some example embodiments may be provided as a complex smart network system integrating lighting technology using a semiconductor light emitting element, such as an LED, or the like, internet of things (IoT) technology, wireless communications technology, and the like. The network system 1000 may be implemented using various display panels, lighting apparatuses, and wired or wireless communications devices, and may also be implemented by software for control, maintenance, and the like, of a sensor, a controller, a communications method, and a network.

The network system 1000 may be applied to a closed space defined as a space within a building, such as a house or an office, an open space, such as a park and a street, or the like. The network system 1000 may be implemented based on the IoT environment to collect and process various types of information and provide the information to a user. In this case, an LED lamp 1200 included in the network system 1000 may include a light source module illustrated in FIG. 1. The LED lamp 1200 may receive information on surroundings from a gateway 1100 to control illumination of the LED lamp 1200. In some example embodiments, the LED lamp 1200 may play a role in confirming and controlling an operating state of other devices 1300 to 1800, included in the IoT environment, based on a function of visible light communications of the LED lamp 1200, or the like.

With reference to FIG. 20, the network system 1000 may include the gateway 1100 to process data transmitted and received according to different communications protocols, the LED lamp 1200 connected to communicate with the gateway 1100 and including an LED as a light source, and a plurality of devices 1300 to 1800, connected to communicate with the gateway 1100 according to various wireless communications methods. In order to implement the network system 1000 based on the IoT environment, each of the devices 1300 to 1800, such as the LED lamp 1200, may include at least one communications module. In some example embodiments, the LED lamp 1200 may be connected to communicate with the gateway 1100 through a wireless communications protocol, such as Wi-Fi, ZigBee®, Li-Fi, or the like. To this end, the LED lamp 1200 may include at least one communications module for a lamp 1210.

As described above, the network system 1000 may be applied to an open space, such as a street or a park, as well as a closed space, such as a house or an office. In the case that the network system 1000 is applied to a house, the plurality of devices 1300 to 1800, included in the network system 1000 and connected to communicate with the gateway 1100 based on the IoT technology may include a home appliance 1300, a digital door lock 1400, a garage door lock 1500, a lighting switch 1600 installed on a wall, or the like, a router 1700 to intermediate wireless communications networks, a mobile device 1800, such as a smartphone, a tablet PC, a laptop computer, or the like.

In the network system 1000, the LED lamp 1200 may confirm an operating state of the various devices 1300 to 1800 by using a wireless communications network installed in an interior of a house, such as ZigBee®, Wi-Fi, Li-Fi, or the like. Alternatively, the LED lamp 1200 may automatically adjust illuminance of the LED lamp 1200 depending on surroundings and situations. In some example embodiments, the LED lamp 1200 may control the devices 1300 to 1800 included in the network system 1000 through Li-Fi communications using visible light emitted by the LED lamp 1200.

The LED lamp 1200 may automatically adjust the illuminance of the LED lamp 1200 through the communications module for a lamp 1210, based on information on surroundings, sent by the gateway 1100 or collected by a sensor mounted on the LED lamp 1200. For example, the illuminance of the LED lamp 1200 may be automatically adjusted depending on a type of a program being broadcast on a television 1310 employing the display panel in FIG. 2 or a brightness of a TV screen. To this end, the LED lamp 1200 may receive information on an operation of the television 1310 from the communications module for a lamp 1210 connected to the gateway 1100. The communications module for a lamp 1210 may be modularized to be integrated with a sensor and/or a controller included in the LED lamp 1200.

For example, in the case that a program broadcast on TV is a drama, lighting may create a cozy atmosphere based on a desired (and/or alternatively predetermined) value in such a manner that a color temperature is reduced to 12,000 K or lower, in detail, 6,000 K, and color is adjusted. Alternatively, in the case that a program broadcast on TV is a comedy program, the network system 1000 may be configured so that the color temperature may be increased to 6,000 K or higher, and the lighting may be adjusted to be blue-based white lighting, depending on the desired (and/or alternatively predetermined) value.

In some example embodiments, in a case in which a specific period of time passes after the digital door lock 1400 is locked without a person present in the interior of a house, an entirety of the LED lamps 1200 that are turned on may be turned off, thus limiting and/or preventing wastage of electricity. Alternatively, in a case in which a security mode is set through the mobile device 1800, or the like, if the digital door lock 1400 is locked without a person in the interior of a house, the LED lamp 1200 may also be kept turned on.

An operation of the LED lamp 1200 may also be controlled depending on information on surroundings collected through various sensors connected to the network system 1000. For example, in the case that the network system 1000 is implemented within a building, efficient facility management or efficient use of unused space may be possible in such a manner that lighting, a position sensor, and a communications module may be combined, and location information on people within the building may be collected to turn the lighting on or off or provide the collected information in real time. In general, a lighting apparatus, such as the LED lamp 1200, is disposed in almost an entirety of a space on each floor within the building. Therefore, through a sensor provided to be integrated with the LED lamp 1200, various types of information within the building may be collected to be used in facility management, to increase the use of unused space, or the like.

In the meantime, the LED lamp 1200 may be combined with an image sensor, a storage device, the communications module for a lamp 1210, and the like, to be used as a device to maintain security in the building or to detect and respond to an emergency situation. For example, in a case in which a smoke sensor, a temperature sensor, or the like, is mounted on the LED lamp 1200, the occurrence of a fire, or the like, may be detected rapidly, thereby significantly reducing damage. In some example embodiments, the brightness of lighting may be adjusted in consideration of external weather conditions, an amount of natural light, and the like, thus saving energy and providing ideal lighting settings.

As set forth above, according to example embodiments of the present inventive concepts, a display panel and a multivision apparatus without heterogeneity on a boundary of a unit display panel may be provided in such a manner that a light emitting diode (LED) is mounted in a region of the unit display panel not displaying an image.

While example embodiments have been shown and described above, it will be apparent to those skilled in the art that modifications and variations could be made without departing from the scope of the present inventive concepts as defined by the appended claims.

What is claimed is:

1. A display panel, comprising:
   a first region including a plurality of first pixels, the plurality of first pixels included in at least one of one or more rows of pixels and one or more columns of pixels, each first pixel of the plurality of first pixels including,
     a first pixel circuit including at least one switching device and at least one capacitor; and
   a second region including a plurality of second pixels, the plurality of second pixels included in at least one of the one or more rows of pixels and the one or more columns of pixels, the second region adjacent to the first region, the second region having an area smaller than an area of the first region, each second pixel of the plurality of second pixels including,
     a second pixel circuit having a structure different from a structure of the first pixel circuit,
   wherein the first region and the second region are configured to collectively display a single image,
   wherein each second pixel of the plurality of second pixels includes
     a light emitting diode (LED) array, the LED array including a plurality of LEDs, each LED including a first conductive semiconductor layer, an active layer, and a second conductive semiconductor layer, the LED array having a first surface and a second surface opposite to the first surface,
     an electrode portion on the first surface of the LED array, the electrode portion electrically connected to the plurality of LEDs, the electrode portion configured to enable selective driving of each LED of the plurality of LEDs,
     a plurality of light control portions on the second surface of the LED array, the light control portions on separate, respective LEDs of the plurality of LEDs, the light control portions configured to provide one of red light, green light, and blue light, and
     a partition wall between the light control portions, the partition wall configured to separate the light control portions from each other.

2. The display panel of claim 1, wherein the second region includes,
   a circuit board; and
   a plurality of light emitting diode (LED) cells on the circuit board, the plurality of LED cells collectively configured to emit red light, green light, and blue light;
   wherein each second pixel of the plurality of second pixels includes one or more LED cells configured to emit one or more of red light, green light, and blue light.

3. The display panel of claim 2, wherein the circuit board includes a flexible substrate.

4. The display panel of claim 1, wherein,
   the plurality of LEDs are configured to emit blue light;
   the plurality of light control portions includes a first light control portion, the first light control portion including a first wavelength conversion portion, the first wavelength conversion portion including a red phosphor; and
   the plurality of light control portions includes a second light control portion, the second light control portion including a second wavelength conversion portion, the second wavelength conversion portion including a green phosphor.

5. The display panel of claim 1, wherein,
   the LED array includes an encapsulation portion between the plurality of LEDs, the encapsulation portion configured to separate the LEDs from each other; and
   the encapsulation portion is connected to the partition wall.

6. The display panel of claim 1, wherein the partition wall has a thickness that is greater than a thickness of each light control portion of the plurality of light control portions.

7. The display panel of claim 1, wherein the first region is one of,
   a liquid crystal display (LCD);
   an organic light emitting diode (OLED) display; and
   a laser display.

8. The display panel of claim 1, wherein,
   the first region includes,
      a thin film transistor (TFT) substrate, the TFT substrate including the first pixel circuit including the at least one switching device and the at least one capacitor,
      a color filter substrate facing the TFT substrate, and
      a liquid crystal layer between the TFT substrate and the color filter substrate; and
   the plurality of second pixels and the color filter substrate are on a common, coplanar layer surface.

9. The display panel of claim 1, wherein,
   the first region includes,
      a TFT substrate, the TFT substrate including the first pixel circuit having the at least one switching device and the at least one capacitor,
      an upper substrate facing the TFT substrate, and
      an organic light emitting diode (OLED) between the TFT substrate and the upper substrate; and
   the plurality of second pixels and the upper substrate are on a common, coplanar layer surface.

10. A multivision apparatus, comprising:
   at least one display panel, including,
      a plurality of first regions adjacent to each other in one or more rows and in one or more columns; and
      a plurality of second regions between the plurality of first regions, the first regions and the second regions configured to collectively display an individual image;
   wherein the at least one display panel includes at least one second region of the plurality of second regions and at least one first region of the plurality of first regions,
   wherein the plurality of first regions and the plurality of second regions include a plurality of first pixels and a plurality of second pixels, respectively,
   wherein the plurality of first pixels and the plurality of second pixels are included in a common array, the common array including a plurality of rows of pixels and columns of pixels,
   wherein each second pixel of the plurality of second pixels includes
      a light emitting diode (LED) array, the LED array including a plurality of LEDs, each LED including a first conductive semiconductor layer, an active layer, and a second conductive semiconductor layer, the LED array having a first surface and a second surface opposite to the first surface;
      an electrode portion on the first surface of the LED array, the electrode portion electrically connected to the plurality of LEDs, the electrode portion configured to enable selective driving of each LED of the plurality of LEDs;
      a plurality of light control portions on the second surface of the LED array, the light control portions on separate, respective LEDs of the plurality of LEDs, the light control portions configured to provide one of red light, green light, and blue light; and
      a partition wall between the light control portions, the partition wall configured to separate the light control portions from each other.

11. The multivision apparatus of claim 10, wherein,
   the at least one display panel is a plurality of display panels;
   a first display panel of the plurality of display panels is on a surface facing a second display panel of the plurality of display panels, the second display panel being adjacent to the first display panel; and
   each display panel of the plurality of display panels includes a connector configured to supply and/or receive an image signal and electrical power.

12. The multivision apparatus of claim 11, wherein,
   the connector includes a magnetic connector; and
   the first display panel is connected to the second display panel based on a magnetic force between magnetic connectors of the first and second display panels.

13. The multivision apparatus of claim 10, wherein,
   the at least one display panel is a plurality of display panels; and
   each display panel of the plurality of display panels includes an apparatus configured to process an image.

14. A multivision apparatus, comprising:
   an array of interconnected display panels collectively forming an individual multivision display screen, each display panel including,
      a connector configured to receive an input image signal including information associated with an image;
      a display screen including a first region of first pixels and a second region of second pixels, the first pixels and second pixels having different physical circuit structures, respectively; and
      a panel controller configured to,
         generate a display image based on processing the input image signal, and
         control the display screen to cause the first and second pixels to collectively display the display image, wherein each second pixel includes,
- a light emitting diode (LED) array, the LED array including a plurality of LEDs, each LED including a first conductive semiconductor layer, an active layer, and a second conductive semiconductor layer, the LED array having a first surface and a second surface opposite to the first surface,
- an electrode portion on the first surface of the LED array, the electrode portion electrically connected to the plurality of LEDs, the electrode portion configured to enable selective driving of each LED of the plurality of LEDs,
- a plurality of light control portions on the second surface of the LED array, the light control portions on separate, respective LEDs of the plurality of LEDs, the light control portions configured to provide one of red light, green light, and blue light, and
- a partition wall between the light control portions, the partition wall configured to separate the light control portions from each other.

15. The multivision apparatus of claim 14, wherein, the first region is one of,
- a liquid crystal display (LCD),
- an organic light emitting diode (OLED) display,
- a laser display, and
- light emitting diode (LED) display.

16. The multivision apparatus of claim 14, wherein, at least one panel controller, of at least one display panel of the array, is configured to,
- determine a location of each display panel in the array, in relation to the at least one display panel;
- based on processing the input image signal, divide the image into separate sub-images, based on an arrangement of the display panels in the array;
- associate each sub-image with a separate display panel of the array of display panels;
- generate image data based on the associating, the image data including information indicating at least one sub-image of the image and a display panel associated with each sub-image of the at least one sub-image; and
- transmit the image data to at least one adjacent, connected display panel in the array through at least one connector of the at least one display panel, such that,
  - the image data is distributed, through the array, to each display panel of the array, and
  - the array of interconnected display panels collectively display the image on the multivision display screen, based on each separate display panel displaying a separate, associated sub-image.

17. The multivision apparatus of claim 14, wherein, each display panel of the array includes at least one connector that further includes a magnetic connector.

18. The multivision apparatus of claim 14, wherein, at least one display panel of the array of interconnected display panels includes a flexible circuit board configured to flexibly connect the at least one display panel with at least one other display panel of the array, such that the multivision display screen includes a curved display screen portion.

* * * * *